(12) United States Patent
Lee et al.

(10) Patent No.: US 10,497,422 B2
(45) Date of Patent: Dec. 3, 2019

(54) MEMORY DEVICE PERFORMING CARE OPERATION FOR DISTURBED ROW AND OPERATING METHOD THEREOF

(71) Applicant: SAMSUNG ELECTRONICS CO., LTD., Suwon-si, Gyeonggi-do (KR)

(72) Inventors: Seung-jun Lee, Seoul (KR); Seung-jun Shin, Incheon (KR); Hoon Sin, Suwon-si (KR); Ik-joon Choi, Suwon-si (KR); Ju-seong Hwang, Daegu (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 15/869,803

(22) Filed: Jan. 12, 2018

(65) Prior Publication Data

US 2018/0342283 A1 Nov. 29, 2018

(30) Foreign Application Priority Data

May 24, 2017 (KR) .................. 10-2017-0064386

(51) Int. Cl.
*G11C 11/406* (2006.01)
*G11C 11/408* (2006.01)

(52) U.S. Cl.
CPC ...... *G11C 11/40615* (2013.01); *G11C 11/408* (2013.01)

(58) Field of Classification Search
CPC ............ G11C 11/40615; G11C 11/408; G11C 11/40611; G11C 11/40618; G11C 11/40626; G11C 2211/406; G11C 2211/4062; G11C 2211/4065; G11C 2211/4066; G11G 2211/401
See application file for complete search history.

(56) References Cited

U.S. PATENT DOCUMENTS

| | | | |
|---|---|---|---|
| 7,492,658 B2* | 2/2009 | Oh ........................ | G11C 11/406 365/189.07 |
| 8,392,650 B2 | 3/2013 | Bains | |
| 9,032,141 B2* | 5/2015 | Bains .................. | G11C 11/4078 711/106 |
| 9,299,400 B2* | 3/2016 | Bains .................... | G11C 11/406 |
| 9,390,782 B2 | 7/2016 | Best et al. | |
| 9,431,085 B2 | 8/2016 | Greenberg et al. | |

(Continued)

OTHER PUBLICATIONS

Youji Idei, Katsuhiro Shimohigashi, Dual-Period Self-Refresh Scheme for Low-Power DRAM's with On-Chip PROM Mode Register, IEEE Journal of Solid-State Circuits, vol. 33, No. 2, Feb. 1998. (Year: 1998).*

*Primary Examiner* — Khoa D Doan
(74) *Attorney, Agent, or Firm* — Lee & Morse, P.C.

(57) ABSTRACT

A memory device includes a memory cell array, a refresh controller, and control logic. The memory cell array includes a plurality of rows. The refresh controller performs a refresh operation on the plurality of rows. The control logic controls a care operation on a first adjacent region that is most adjacent to a first row based on a number of times the plurality of rows are accessed during a first period. The control logic also controls a care operation on a second adjacent region that is second adjacent to a second row based on a number of times the plurality of rows are accessed during a second period. The first and second periods are different periods.

19 Claims, 29 Drawing Sheets

(56) References Cited

U.S. PATENT DOCUMENTS

| | | | |
|---|---|---|---|
| 10,019,350 B1* | 7/2018 | Lee | G06F 12/0207 |
| 10,062,427 B2* | 8/2018 | Bae | G11C 29/24 |
| 10,325,643 B2* | 6/2019 | Yun | G11C 11/40611 |
| 2002/0196669 A1* | 12/2002 | Hsu | G11C 7/1042 |
| | | | 365/189.04 |
| 2009/0213675 A1* | 8/2009 | Shino | G11C 11/4076 |
| | | | 365/205 |
| 2013/0268727 A1* | 10/2013 | Sohn | G11C 8/00 |
| | | | 711/105 |
| 2013/0326162 A1* | 12/2013 | Moon | G06F 12/00 |
| | | | 711/154 |
| 2014/0006703 A1* | 1/2014 | Bains | G11C 11/40618 |
| | | | 711/106 |
| 2014/0013036 A1* | 1/2014 | Kwon | G11C 11/40615 |
| | | | 711/103 |
| 2014/0056090 A1* | 2/2014 | Kwon | G11C 7/02 |
| | | | 365/207 |
| 2014/0281203 A1* | 9/2014 | Damle | G11C 11/406 |
| | | | 711/106 |
| 2014/0359208 A1 | 12/2014 | Song | |
| 2015/0055420 A1* | 2/2015 | Bell | G11C 7/1012 |
| | | | 365/189.02 |
| 2015/0187436 A1 | 7/2015 | Querbach et al. | |
| 2016/0086649 A1* | 3/2016 | Hong | G11C 11/406 |
| | | | 365/96 |
| 2016/0276015 A1 | 9/2016 | Bains et al. | |
| 2017/0139641 A1* | 5/2017 | Cha | G11C 11/40611 |
| 2019/0066808 A1* | 2/2019 | Nale | G11C 16/3418 |

\* cited by examiner

US 10,497,422 B2

MEMORY DEVICE PERFORMING CARE OPERATION FOR DISTURBED ROW AND OPERATING METHOD THEREOF

CROSS-REFERENCE TO RELATED APPLICATION

Korean Patent Application No. 10-2017-0064386, filed on May 24, 2017, and entitled, "Memory Device Performing Care Operation for Disturbed Row and Operating Method Thereof," is incorporated by reference herein in its entirety.

BACKGROUND

1. Field

One or more embodiments herein relate to a memory device for performing a care operation for a disturbed row and method for operating a memory device.

2. Description of the Related Art

Improving the integration and speed memory devices continues to be a goal of system designers. In a dynamic random access memory (DRAM), stress is applied to memory cells that are adjacent to other memory cells that are accessed an increased number of times. This stress may reduce the data retention characteristics of the adjacent memory cells, and thus may adversely affect the data reliability of the entire DRAM.

As one example, when memory cells connected to a specific word line is accessed with increased frequency, data retention characteristics of memory cells connected to a word line adjacent to the specific word line is reduced. Also, the access frequency of memory cells may also increase as the size of the DRAM is reduced. For this reason, the number of memory cells that experience adverse data retention characteristics may increase.

SUMMARY

In accordance with one or more embodiments, a memory device includes a memory cell array including a plurality of rows; a refresh controller to perform a refresh operation on the plurality of rows; and a control logic to control a care operation on a first adjacent region that is most adjacent to a first row based on a number of times the plurality of rows are accessed during a first period and to control a care operation on a second adjacent region that is second adjacent to a second row based on a number of times the plurality of rows are accessed during a second period, wherein the first and second periods are different periods.

In accordance with one or more other embodiments, a method is provided for operating a memory device which includes a memory cell array having a plurality of rows and first to nth adjacent regions (n is an integer equal to or more than 2) that are based on a degree of adjacency to a first row. The method includes performing a counting operation on number of accesses of the plurality of rows to determine an intensively accessed row; selecting one adjacent region from among the first to nth adjacent regions based on a condition of performing the counting operation; and performing a care refresh operation on one or more rows in the selected one adjacent region.

In accordance with one or more other embodiments, a method is provided for operating a memory device, including a memory cell array including first to mth rows (m is an integer equal to or more than 2). The method includes determining an hth row based on a result obtained by counting a number of accesses of each of the first to mth rows during a first period; refreshing an h−1st row and an h+1st row of rows adjacent to the hth row; determining an ith row based on a result obtained by counting a number of accesses of each of the first to mth rows during a second period; and refreshing an i−2nd row and an i+2nd row of rows adjacent to the ith row.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
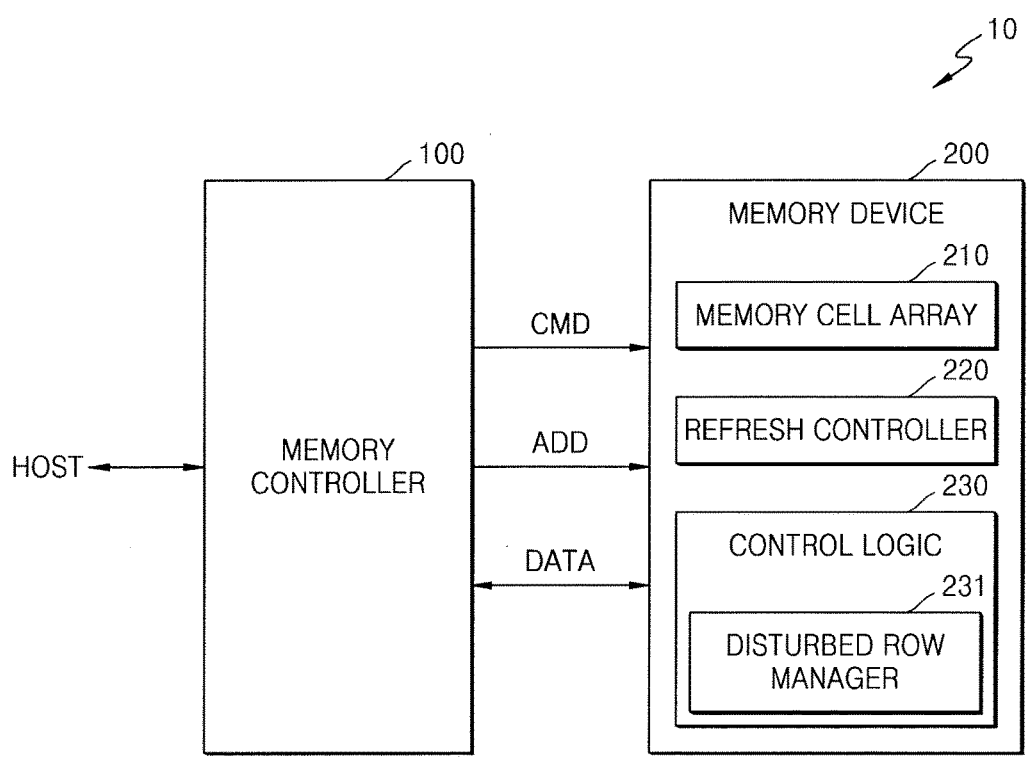
FIG. 1 illustrates an embodiment of a memory system.

FIG. 1 illustrates an embodiment of a memory system 10 which may include a memory controller 100 and a memory device 200. The memory device 200 may include a memory cell array 210, a refresh controller 220, and a control logic 230. According to an exemplary embodiment, the control logic 230 may include a disturbed row manager 231 which may perform a management operation on one or more disturbed rows. The disturbed row manager 231 may perform management of a disturbed row with software or hardware. In one embodiment, the disturbed row manager 231 may perform management of a disturbed row by using a combination of hardware and software. The control logic 230 may include other elements for controlling a memory operation, in addition to the disturbed row manager 231.

The memory controller 100 may provide various signals to the memory device 200 through a memory interface. The signals may control a memory operation including a write operation and a read operation. For example, the memory controller 100 may provide a command CMD and an address ADD to the memory device 200 to access data DATA of the memory cell array 210. The command CMD may include a command for a normal memory operation such as writing and reading of data. Also, when the memory device 200 includes a dynamic random access memory (DRAM) cell, the command CMD may include a refresh command for refreshing various unique operations (for example, memory cells) associated with DRAM.

The memory controller 100 may access the memory device 200 based on a request from a host HOST. The memory controller 100 may communicate with the host HOST using various protocols. The memory cell array 210 may include a plurality of memory cells. For example, the memory cell array 210 may include a plurality of word lines, and a plurality of memory cells may be connected to each of the word lines. Memory cells connected to one word line may be referred to, for example, as a row. The memory cell array 210 may include a plurality of rows.

According to an exemplary embodiment, when one row is intensively or frequently accessed (or activated), a plurality of adjacent regions may be detected based on a degree of adjacency to the intensively accessed row. For example, a first adjacent region that is most adjacent to the intensively accessed row and a second adjacent region that is the next adjacent one thereto may be detected.

In one embodiment, a plurality of (for example, n number of) adjacent regions adjacent to the intensively accessed row may be detected. In this case, the first adjacent region may include rows (for example, adjacent rows) that are relatively most adjacent to the intensively access row. An nth adjacent region may include rows relatively less adjacent to the intensively access row. Also, each of the adjacent regions may include one row or two or more rows, e.g., each adjacent region may include one row or two or more rows.

The refresh controller 220 may refresh rows of the memory cell array 210 based on a refresh command from the memory controller 100. In one embodiment, the refresh controller 220 may refresh the rows of the memory cell array 210 without intervention by the memory controller 100 in a self-refresh mode. Also, according to an embodiment, when a certain row is intensively accessed, the refresh controller 220 may refresh one or more rows adjacent to the intensively accessed row based on control by the control logic 230.

A certain row (for example, a first row) may be intensively accessed while a memory operation is being performed. At this time, rows adjacent to the first row may be disturbed, and a degree to which the rows are disturbed may be changed based on a degree of adjacency to the first row. For example, a row (for example, a second row) closest to the first row may be disturbed by the greatest amount, but a row (for example, a third row) disposed relatively less close to the first row than the second row may be disturbed by a lesser amount. The second and third rows may be disturbed as a result of the first row being accessed intensively (e.g., by an increased number of times, or greater than a predetermined number of times), and thus each of the second and third rows may be referred to as a disturbed row.

As described above, a plurality of disturbed rows may appear based on a degree of adjacency to an intensively accessed row. The control logic 230 may perform a disturbed row management operation on rows adjacent to the intensively accessed row, for maintaining data reliability. The disturbed row management operation may be performed using different methods according to, for example, a degree of adjacency. In one embodiment, the disturbed row management operation may include an operation of determining an intensively accessed row and an operation of detecting a plurality of disturbed rows having different degrees of adjacency to the intensively accessed row based on different methods. The disturbed row management operation may also include an operation of caring for the detected plurality of disturbed rows.

According to an embodiment, the disturbed row manager 231 may count the number of times rows are accessed (or activated) according to the command CMD and the address ADD from the memory controller 100. Also, the disturbed row manager 231 may detect a plurality of adjacent regions having different degrees of adjacency to a first row which is most accessed in a certain period. For example, when three adjacent regions are detected, the disturbed row manager 231 may detect a first adjacent region that is most adjacent to the first row, a second adjacent region that is next (or second) adjacent thereto, and a third adjacent region that is next (or third) adjacent thereto.

Moreover, rows adjacent to the first row may include a row upward adjacent to and a row downward adjacent to a plurality of rows arranged in parallel. According to an embodiment, the first adjacent region may include a first adjacent row that is most adjacent to the first row. In this case, the first adjacent row may include two adjacent rows upward and downward adjacent to the first row. Similarly, each of the second and third adjacent regions may include second and third adjacent rows, and each of the second and third adjacent rows may include two adjacent rows.

In the above-described embodiment, the intensively accessed row has been described above as corresponding to a row which is the accessed the most (e.g., with the greatest frequency or number of times) in a certain period. In one embodiment, the intensively accessed row may be determined based on various other criteria. For example, each of two or more rows that are the accessed the most may be determined as an intensively accessed row, or a row which is continuously accessed more than a reference value may be determined as an intensively accessed row. In this manner, a determination operation may be performed by various methods.

An example of a care operation performed on detected adjacent regions includes the disturbed row manager 231 controlling a refresh operation (for example, a care refresh operation). According to an embodiment, the first adjacent region may include rows which are disturbed the greatest amount by the intensively accessed first row. Thus, the care refresh operation may be performed on the first adjacent region at the shortest period. The third adjacent region may include rows which are relatively less disturbed by the first row. Thus, the care refresh operation may be performed on the third adjacent region at a period which is relatively longer than that of the first adjacent region.

The control logic 230 may provide the refresh controller 220 with an address of a row in a detected adjacent region. The refresh controller 220 may perform the care refresh operation based on the address. For example, the refresh controller 220 may include an internal counter that generates a counting address for performing a normal refresh operation (or an auto refresh operation). The refresh controller 220 may perform the care refresh operation for caring for a disturbed row according to a certain period simultaneously with performing the normal refresh operation. In one refresh period, rows in the memory cell array 210 may be refreshed at least once according to the normal refresh operation being performed. Also, one or more rows which are disturbed through intensive access may be additionally refreshed.

According to an embodiment, when a certain row is intensively accessed, an optimized care operation may be performed based on a degree of adjacency, even when regions disturbed by process miniaturization are enlarged. As a result, data reliability may be effectively enhanced.

In the above-described embodiment, the refresh operation has been described above as the care operation. In other embodiments, different kinds of care operations may be performed for enhancing data reliability of a disturbed row. For example, the care operation may be performed through moving data, copying data, or other operations relating to the data.

The memory device 200 may include DRAM such as double data rate synchronous dynamic random access memory (DDR SDRAM), low power double data rate (LPDDR) SDRAM, graphics double data rate (GDDR) SDRAM, Rambus dynamic random access memory (RDRAM), or the like. Other embodiments may be applied to a memory device which includes a non-volatile memory such as magnetic RAM (MRAM), ferroelectric RAM (FeRAM), phase change RAM (PRAM), resistive RAM (ReRAM), or the like, for performing a data retention operation corresponding to a refresh operation.

The memory device 200 may include a semiconductor package including one or more memory chips or may include a memory module where a plurality of memory chips are mounted on a module board. In FIG. 1, the memory controller 100 and the memory device 200 are illustrated as different elements. In one embodiment, the memory device 200 may be implemented as a memory system where a memory control function and a memory cell array are integrated into one semiconductor package.

Figure 2A:
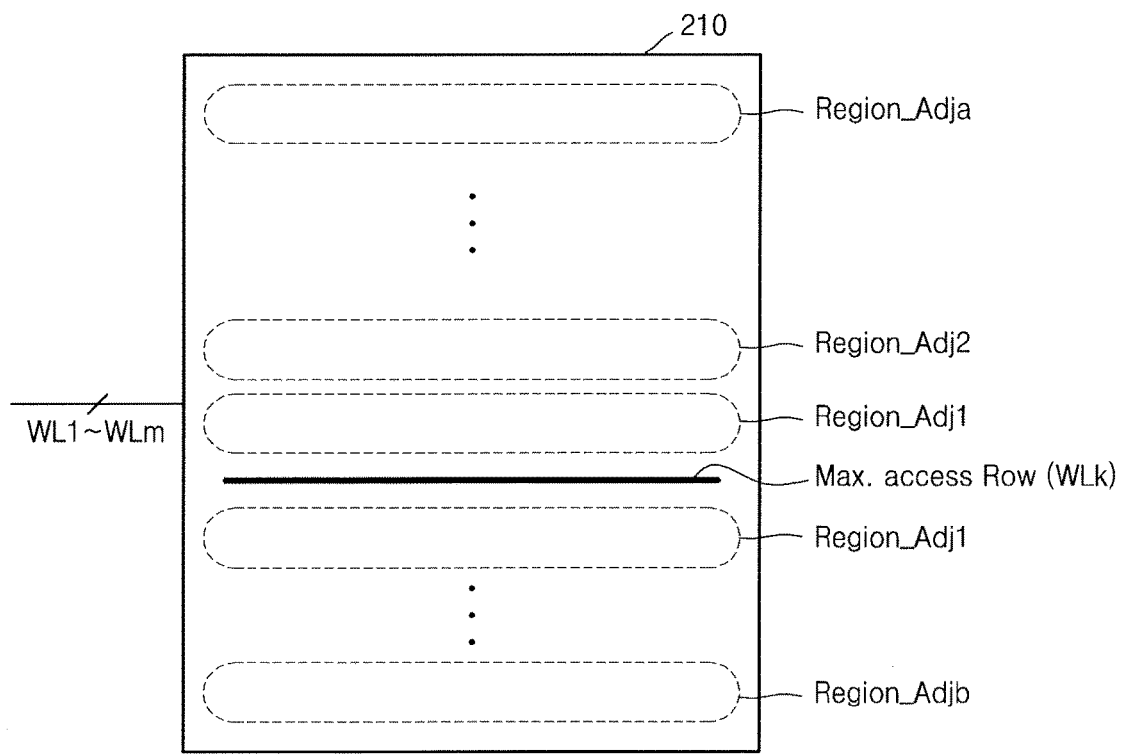
FIGS. 2A, 2B, 3A, and 3B illustrate examples of adjacent rows or regions.

FIGS. 2A, 2B, 3A, and 3B illustrate examples of adjacent rows or adjacent regions which may be classified according to the degree of adjacency. Referring to FIG. 2A, the memory cell array 210 may include a plurality of word lines WL1 to WLm and may determine a row, which is most accessed from among the plurality of word lines WL1 to WLm, based on a certain period. According to an embodiment, a plurality of different periods may be set, and a row which is most accessed may be determined at every period.

When a kth row (for example, memory cells connected to a kth word line WLk) is assumed as a row which is most accessed, a plurality of adjacent regions may be detected based on a degree of adjacency to the kth row. For example, a first adjacent region Region_Adj1. which is most adjacent to an upper side and a lower side of the kth row in the drawing may be detected. Also, a second adjacent region Region_Adj2 that is second adjacent to the kth row may be detected. Also, one or more adjacent regions adjacent to the kth row may be further detected. In FIG. 2A, a number of adjacent regions Region_Adj1 to Region_Adja upward adjacent to the kth row are detected, and b number of adjacent regions Region_Adj1 to Region_Adjb downward adjacent to the kth row are detected.

Each of the adjacent regions Region_Adj1 to Region_Adja and the adjacent regions Region_Adj1 to Region_Adjb illustrated in FIG. 2A may include one or more rows. In the adjacent regions Region_Adj1 to Region_Adja that are adjacent to the right of the kth row, for example, as the kth row is intensively accessed, rows in the first adjacent region Region_Adj1 may be disturbed by the greatest amount. However, rows in an ath adjacent region Region_Adja may be relatively less disturbed. Considering disturbed characteristics based on the degree of adjacency, different collection periods (for example, a period for determining a row which is most accessed) may be applied for each of the adjacent regions when performing a management operation on the adjacent regions Region_Adj1 to Region_Adja. Also, the care operation may be performed according to different periods for each adjacent region.

According to an embodiment, when the kth row is a row that is accessed the most in a relatively shortest period (for example, a first period), rows in the first adjacent region Region_Adj1 may be refreshed. Also, when the kth row is a row which is accessed the most in a period (for example, a second period) longer than the first period, rows in the second adjacent region Region_Adj2 may be refreshed. Also, a row which is accessed the most at a predetermined period (for example, an ath period) which is relatively longer than other periods, and when the kth row is determined as a row which is accessed the most in the ath period, rows in the ath adjacent region Region_Adja may be refreshed.

Figure 2B:
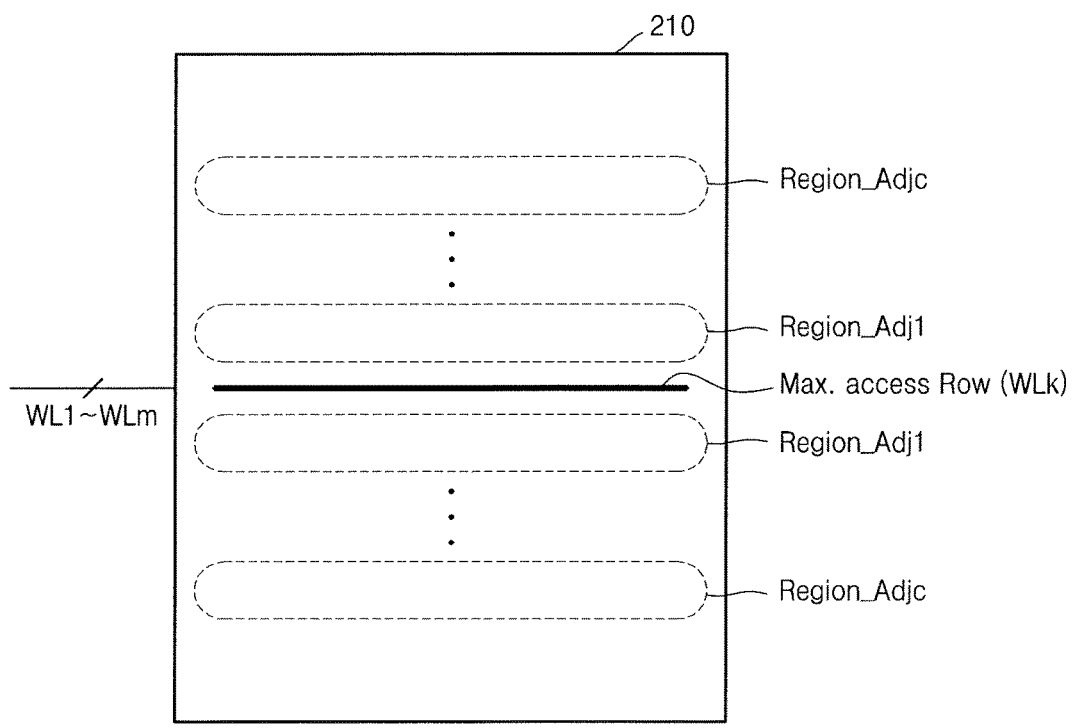

In FIG. 2B, an example where only some rows of a memory cell array are classified into a plurality of adjacent regions is illustrated. Also, FIG. 2B illustrates an example where the same number of adjacent regions are arranged on an upper side and a lower side of the most accessed row.

Referring to FIG. 2B, the kth row which is accessed the most may be determined, and c number of adjacent regions Region_Adj1 to Region_Adjc adjacent to an upper side and a lower side of the kth row may be detected. As in the embodiment of FIG. 2A, each of the adjacent regions Region_Adj1 to Region_Adjc may include one or more rows. When the kth row corresponds to a row which is accessed the most during a first period which is relatively short, a row in a first adjacent region Region_Adj1 that is most adjacent to the kth row may be refreshed. Also, when the kth row corresponds to a row which is accessed the most during a second period which is relatively long, a row in a second adjacent region Region_Adj2 that is next (or second) adjacent to the kth row may be refreshed.

Figure 3A:
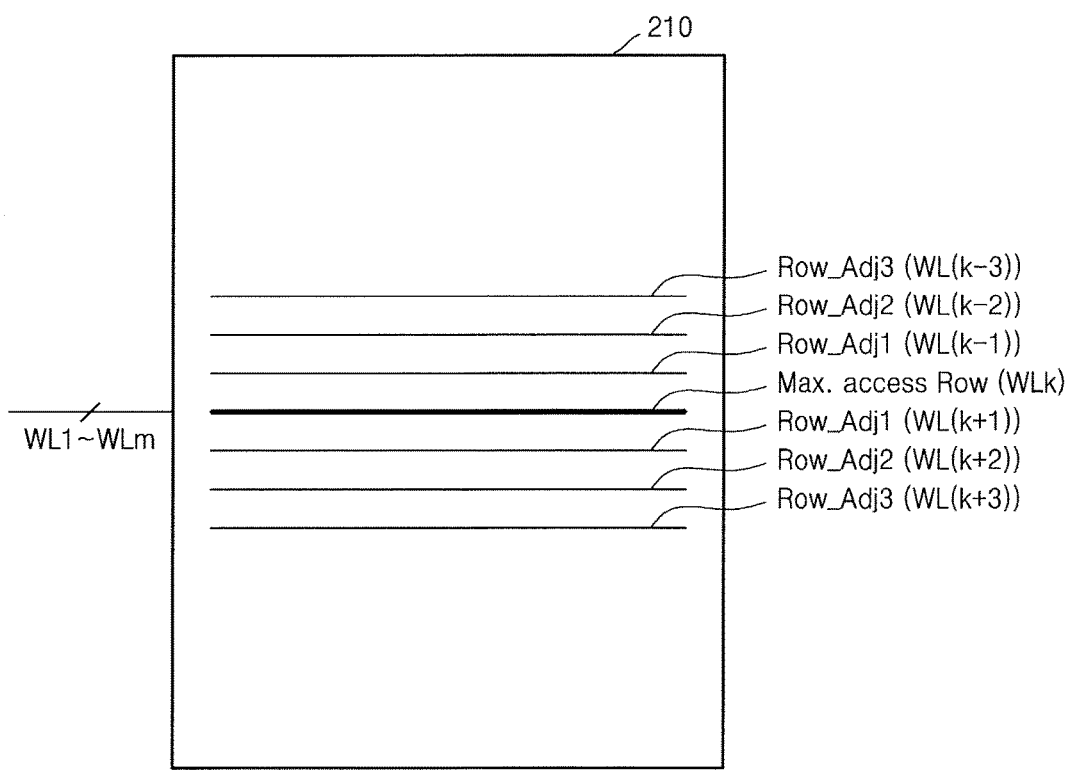
Figure 3B:
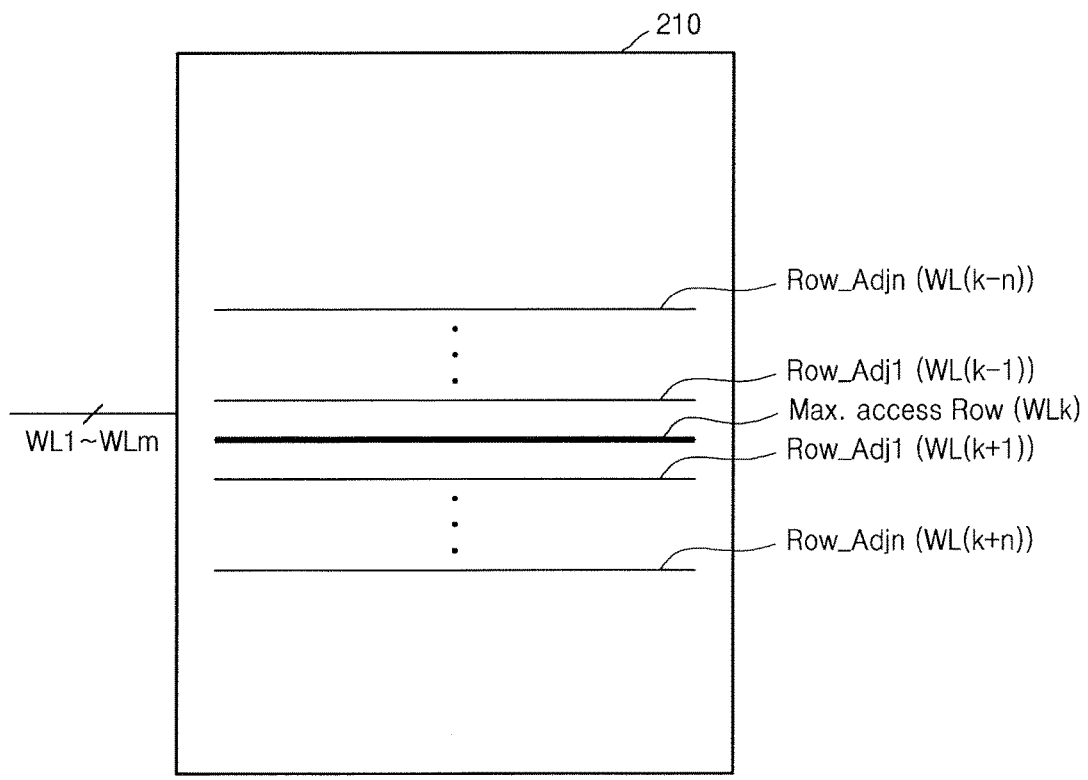

FIGS. 3A and 3B illustrate examples where an adjacent region includes one adjacent row. FIG. 3A illustrates an example where three adjacent rows are detected from each of an upper side and a lower side of the most accessed row. FIG. 3B illustrates an example where n number of adjacent rows are detected from each of an upper side and a lower side of the most accessed row.

Referring to FIG. 3A, a kth row which is accessed the most may be determined, and a first adjacent row that is most adjacent to the kth row may include a k−1st row corresponding to a k−1st word line WL(k−1) and a k+1st row corresponding to a k+1st word line WL(k+1). Also, a second adjacent row second adjacent to the kth row may include a k−2nd row corresponding to a k−2nd word line WL(k−2) and a k+2nd row corresponding to a k+2nd word line WL(k+2). Similarly, a third adjacent row may include a k+3rd row corresponding to a k+3rd word line WL(k+3).

When the kth row is the accessed the most during a first period which is relatively short, the care operation may be performed by refreshing the k−1st and k+1st rows (for example, ±1 adjacent rows). Also, when the kth row is the accessed the most during a third period which is relatively long, the care operation may be performed by refreshing the k−3rd and k+3rd rows (for example, ±3 adjacent rows).

Referring to FIG. 3B, the kth row which is accessed the most may be determined, and first to nth adjacent rows may be detected for the kth row. In this case, an adjacent distance between the nth adjacent row (for example, ±n adjacent rows) and the kth row may be relatively greater than an adjacent distance between the first adjacent row (for example, ±1 adjacent rows) and the kth row.

According to the above-described embodiments, the most adjacent rows capable of being disturbed the most may be detected based on a result of a determination performed in a collection period having a relatively short period. However, a plurality of relatively less adjacent rows may be detected based on a result of a determination performed in a collection period having a relatively long period. Also, the care refresh operation on ±1 adjacent rows may be performed at every relatively short period, but the care refresh operation on ±n adjacent rows may be performed at every relatively long period.

Hereinafter, in describing exemplary embodiments, an adjacent region may be assumed to include one adjacent row (for example, ±1 adjacent rows adjacent to an upper side and a lower side). Also, according to embodiments, for convenience of description, an adjacent region or an adjacent row on which the care operation is to be performed may be referred to as a region or a row.

Figure 4:
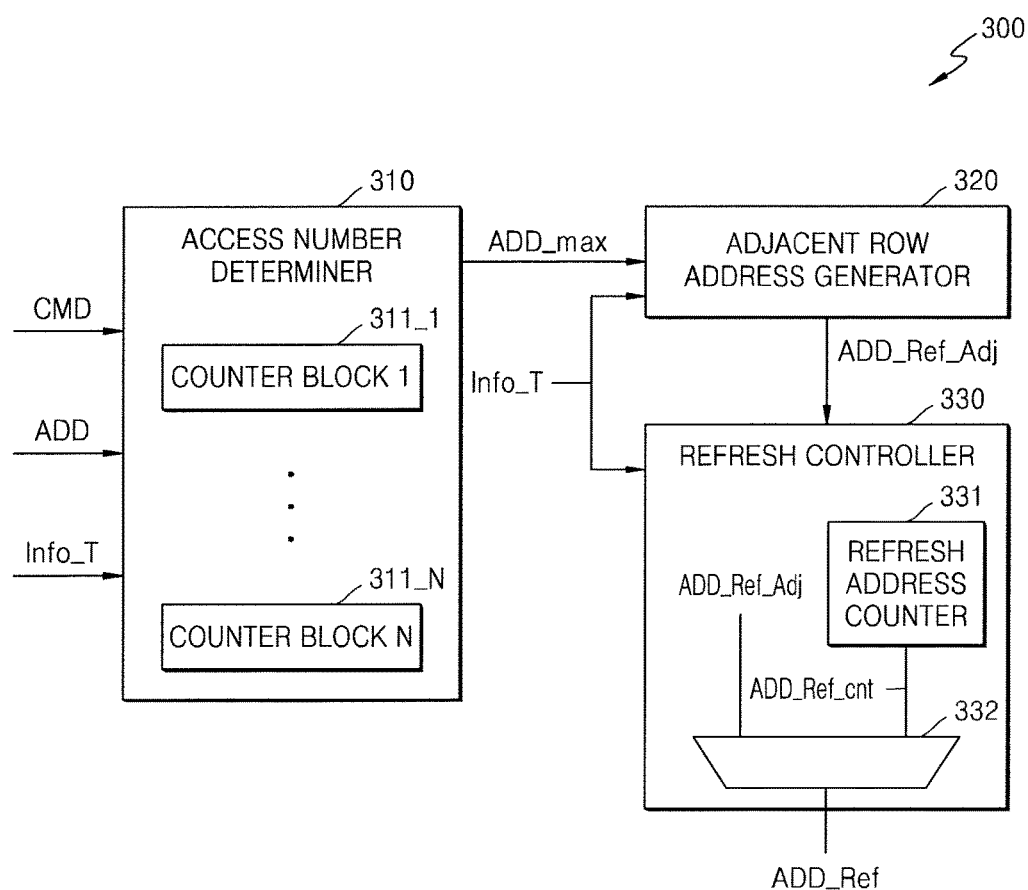
FIG. 4 illustrates an embodiment of a memory device.

FIG. 4 illustrates an embodiment of a memory device 300 which may include an access number determiner 310, an adjacent row address generator 320, and a refresh controller 330. The elements may be implemented in the memory device 300 in various ways. For example, the access number determiner 310 and the adjacent row address generator 320 may be in the control logic 230 of FIG. 1 or may be in the disturbed row manager 231. The embodiments of the access number determiner may be implemented in logic that is software, hardware, or both.

The access number determiner 310 may include first to Nth counter blocks (or simply counters) 311_1 to 311_N. Each of the first to Nth counter blocks 311_1 to 311_N may include a plurality of counters. The access number determiner 310 may perform a counting operation based on an address ADD of an accessed (or activated) row based on a command CMD and may output an address indicating the location of an intensively accessed row based on a counting result. Te access number determiner 310 may, for example, output an address (for example, a maximum access address ADD_max) corresponding to which is accessed the most in a certain period.

According to an embodiment, the access number determiner 310 may perform a counting operation based on period information Info_T. The first counter block 311_1 may perform the counting operation during a first period based on the period information Info_T, and may output a maximum access address ADD_max corresponding to a row which is accessed the most during the first period. Also, the second counter block 311_2 may perform the counting operation during a second period based on the period information Info_T, and may output a maximum access address ADD_max corresponding to a row which is accessed the most during the second period. Similarly, the Nth counter block 311_N may perform the counting operation during an nth period based on the period information Info_T, and may output a maximum access address ADD_max corresponding to a row which is accessed the most during the nth period.

The adjacent row address generator 320 may generate an adjacent row address ADD_Ref_Adj indicating an adjacent row (or a location thereof). According to an embodiment, the adjacent row address generator 320 may generate an adjacent row address ADD_Ref_Adj indicating a corresponding row of adjacent rows having different degrees of adjacency according to various periods. For example, the adjacent row address generator 320 may generate an adjacent row address ADD_Ref_Adj based on the period information Info_T.

When the first counter block 311_1 outputs a maximum access address ADD_max according to a counting result performed during the first period, the adjacent row address generator 320 may, for example, output addresses (e.g., addresses of ±1 adjacent rows) which are the most adjacent to an upper side and a lower side of the maximum access address ADD_max. Also. when the second counter block 311_2 outputs a maximum access address ADD_max according to a counting result performed during the second period, the adjacent row address generator 320 may output addresses (e.g., addresses of ±2 adjacent rows) which are second adjacent to the upper side and the lower side of the maximum access address ADD_max. Also, when the Nth counter block 311_N outputs a maximum access address ADD_max according to a counting result performed during the nth period, the adjacent row address generator 320 may output addresses (e.g., addresses of ±n adjacent rows) which are nth adjacent to the upper side and the lower side of the maximum access address ADD_max.

The refresh controller 330 may include a refresh address counter 331 and a selector 332. The refresh address counter 331 may output a counting address ADD_Ref_cnt for sequentially refreshing rows of a memory cell array. Also, the selector 332 may receive and selectively output the counting address ADD_Ref_cnt and the adjacent row address ADD_Ref_Adj. For example, the selector 332 may output the counting address ADD_Ref_cnt when performing a normal refresh operation. Whenever the first to nth periods arrive, the selector 332 may output the adjacent row address ADD_Ref_Adj.

Figure 5A:
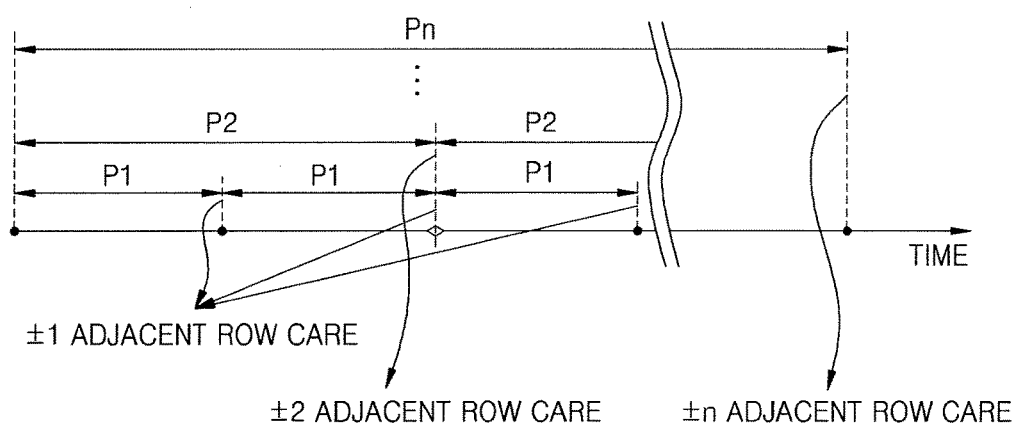
FIGS. 5A and 5B illustrate embodiments of periods for a care operation.
Figure 5B:
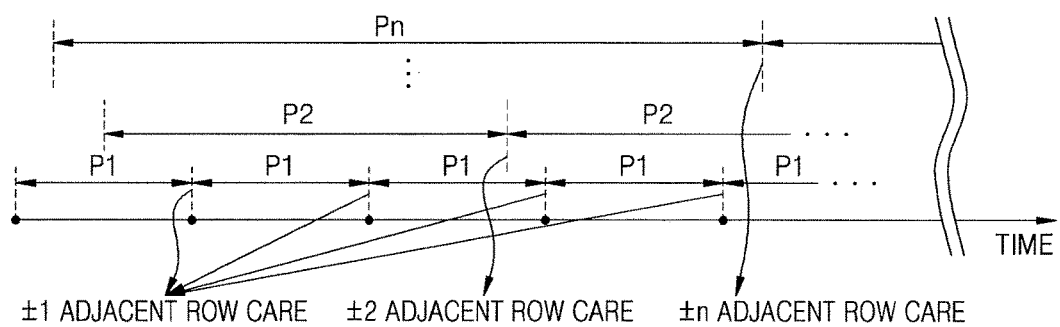

FIGS. 5A and 5B illustrate embodiments for setting various periods for a care operation. Also, in the following embodiments, a care operation may be assumed as corresponding to a care refresh operation.

Referring to FIG. 5A, a first period P1 may be a period which is shorter than other periods P2 to Pn, a row which is accessed the most at every first period P1 may be determined, and the care refresh operation may be performed on rows (±1 adjacent rows) that are most adjacent to the determined row. Also, a second period P2 may be a period which is longer than the first period, a row which is accessed the most at every second period P2 may be determined, and the care refresh operation may be performed on rows (±2 adjacent rows) that are second adjacent to the determined row. In this manner, an nth period Pn may be a period which is longer than the other periods P1 to P(n−1), a row which is accessed the most at every nth period Pn may be determined, and the care refresh operation may be performed on rows (±n adjacent rows) nth adjacent to the determined row.

In FIG. 5A, the first to nth periods P1 to Pn are illustrated as having the same time. In FIG. 5B, the first to nth periods P1 to Pn may have different periods, and times (for example, a time when the most accessed row is determined) of the respective periods may differ.

Figure 6:
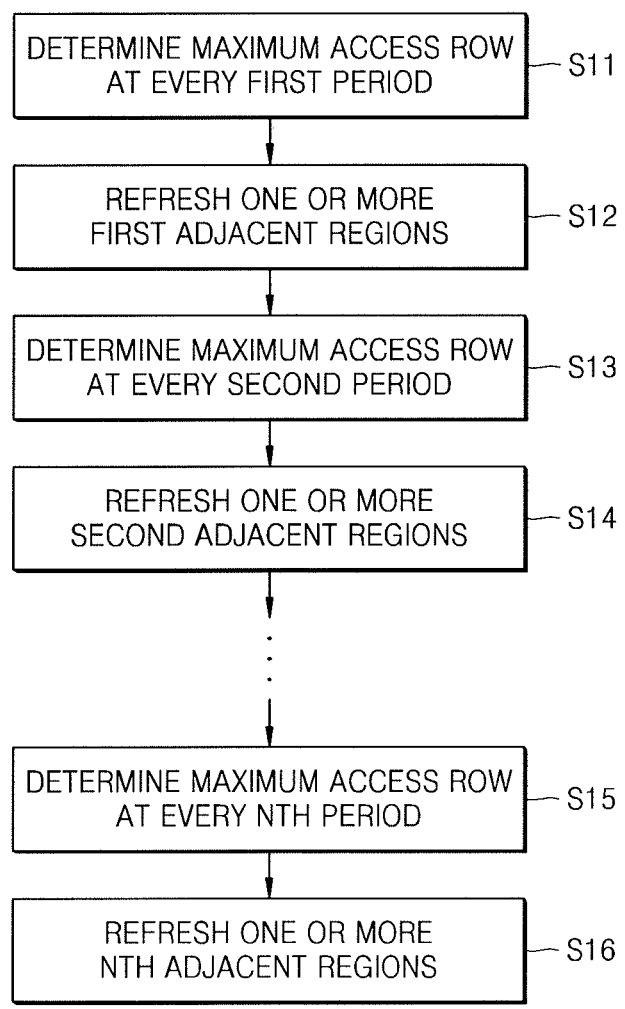
FIGS. 6 and 7 illustrate an embodiment of a method for operating a memory device.
Figure 7:
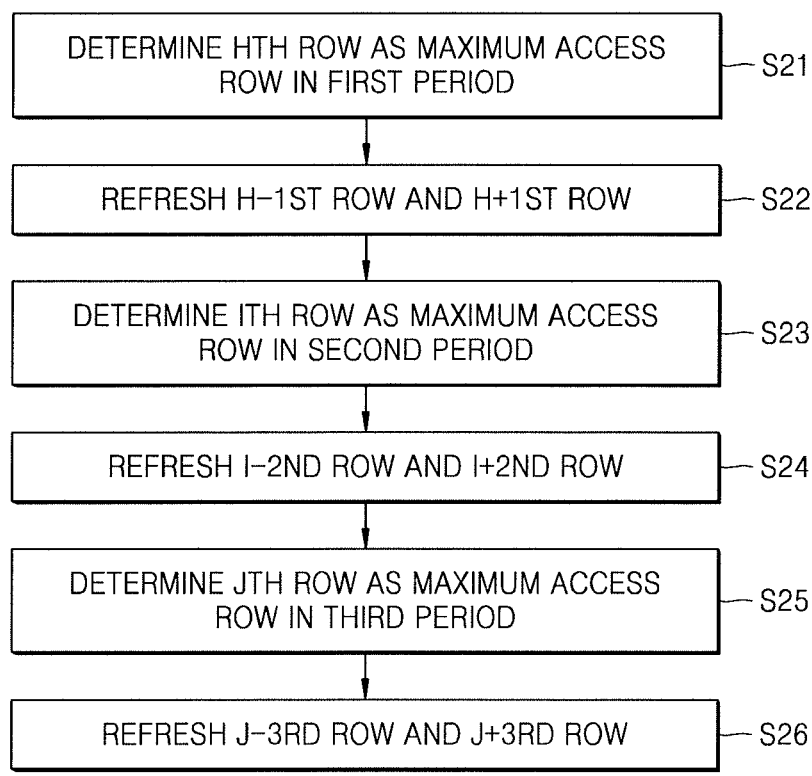

FIGS. 6 and 7 illustrate an embodiment of a method for operating a memory device. Referring to FIG. 6, the memory device may perform a memory operation based on a command and an address from a memory controller. In the memory operation, an access (or active) operation may be performed on a plurality of rows. The memory device may perform a counting operation on accessed rows. The counting operation may be performed, for example, on a plurality of periods, and an intensively accessed row may be determined in each of the periods. For example, n number of periods may be set, and a row which is accessed the most may be determined in each period.

When a first period arrives, the memory device may determine a row (hereinafter referred to as a maximum access row) which is accessed the most during the first period in operation S11. The memory device may refresh one or more first adjacent regions (for example, regions adjacent to an upper side and a lower side) according to a result of the determination in operation S12. The first adjacent region may be a region that is most adjacent to the maximum access row and may include one or more adjacent rows.

Subsequently, when a second period arrives, the memory device may determine a maximum access row in the second period in operation S13 and may refresh one or more second adjacent regions according to a result obtained by determining the maximum access row in operation S14. The second adjacent region may be a region which is second adjacent to the maximum access row. In a similar method, the above-described determination and refresh operation on an adjacent region may be repeatedly performed in a plurality of periods. When n number of periods are set and when an nth period arrives, the memory device may determine a maximum access row in the nth period in operation S15. Based on a result obtained by determining the maximum access row, the memory device may refresh one or more nth adjacent regions in operation S16.

In FIG. 7, an example where a care refresh operation is performed on three rows upward and downward adjacent to the most accessed row will be described. First, when a first period arrives, a maximum access row may be determined during the first period, and, for example, an hth row may be determined as the maximum access row in operation S21. A refresh operation (for example, the care refresh operation) may be performed on rows (for example, ±1 adjacent rows) that are most adjacent to the maximum access row at every first period. Thus, the refresh operation may be performed on an h−1st row and an h+1st row in operation S22.

When a second period arrives, a maximum access row may be determined during the second period, and for example, an ith row may be determined as the maximum access row in operation S23. The refresh operation may be performed on ±2 adjacent rows that are second adjacent to the maximum access row at every second period. Thus, the refresh operation may be performed on an i−2nd row and an i+2nd row in operation S24.

When a third period arrives, a maximum access row may be determined during the third period, and for example, a jth row may be determined as the maximum access row in operation S25. The refresh operation may be performed on ±3 adjacent rows that are third adjacent to the maximum access row at every third period. Thus, the refresh operation may be performed on a j−3rd row and a j+3rd row in operation S26.

Figure 8:
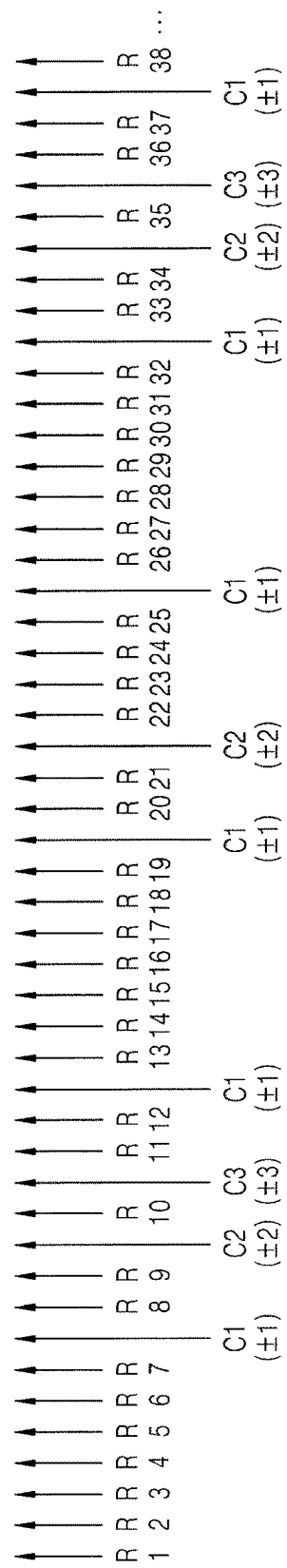
FIG. 8 illustrates an embodiment of a refresh operation.

FIG. 8 illustrates an embodiment of a refresh operation performed by the refresh controller of FIG. 4. An example is illustrated where a care refresh operation is performed on ±1 adjacent rows, ±2 adjacent rows, and ±3 adjacent rows according to first to third periods.

Referring to FIGS. 4 and 8, the refresh controller 330 may output a counting address ADD_Ref_cnt (generated by the refresh address counter 331 in the normal refresh operation) as a refresh address ADD_Ref. The refresh controller 330 may also output (as the refresh address ADD_Ref) an adjacent row address ADD_Ref_Adj for performing the care refresh operation according to a certain period. For example, normal refresh operations R1 to R7 may be performed on first to seventh rows. Then, when the first period arrives, a care refresh operation C1 may be performed on rows (±1 adjacent rows) that are most adjacent to a row which is accessed the most during the first period. Subsequently, a normal refresh operation may be performed (for example, normal refresh operations R8 and R9 may be performed on eighth and ninth rows). Then, when a second period arrives, a care refresh operation C2 may be performed on rows (±2 adjacent rows) that are second adjacent to a row which is accessed the most during the second period.

Similarly, a normal refresh operation may subsequently be performed (for example, a normal refresh operation R10 may be performed on a tenth row). Then, when a third period arrives, a care refresh operation C3 may be performed on rows (±3 adjacent rows) that are third adjacent to a row which is accessed the most during the third period. In FIG. 8, an example is illustrated where the first period corresponds to an interval at which an eight-time normal refresh operation is performed, the second period corresponds to an interval at which a sixteen-time normal refresh operation is performed, and the third period corresponds to an interval at which a thirty-two-time normal refresh operation is performed. In other embodiments, the first to third periods may be set in a different manner.

Figure 9:
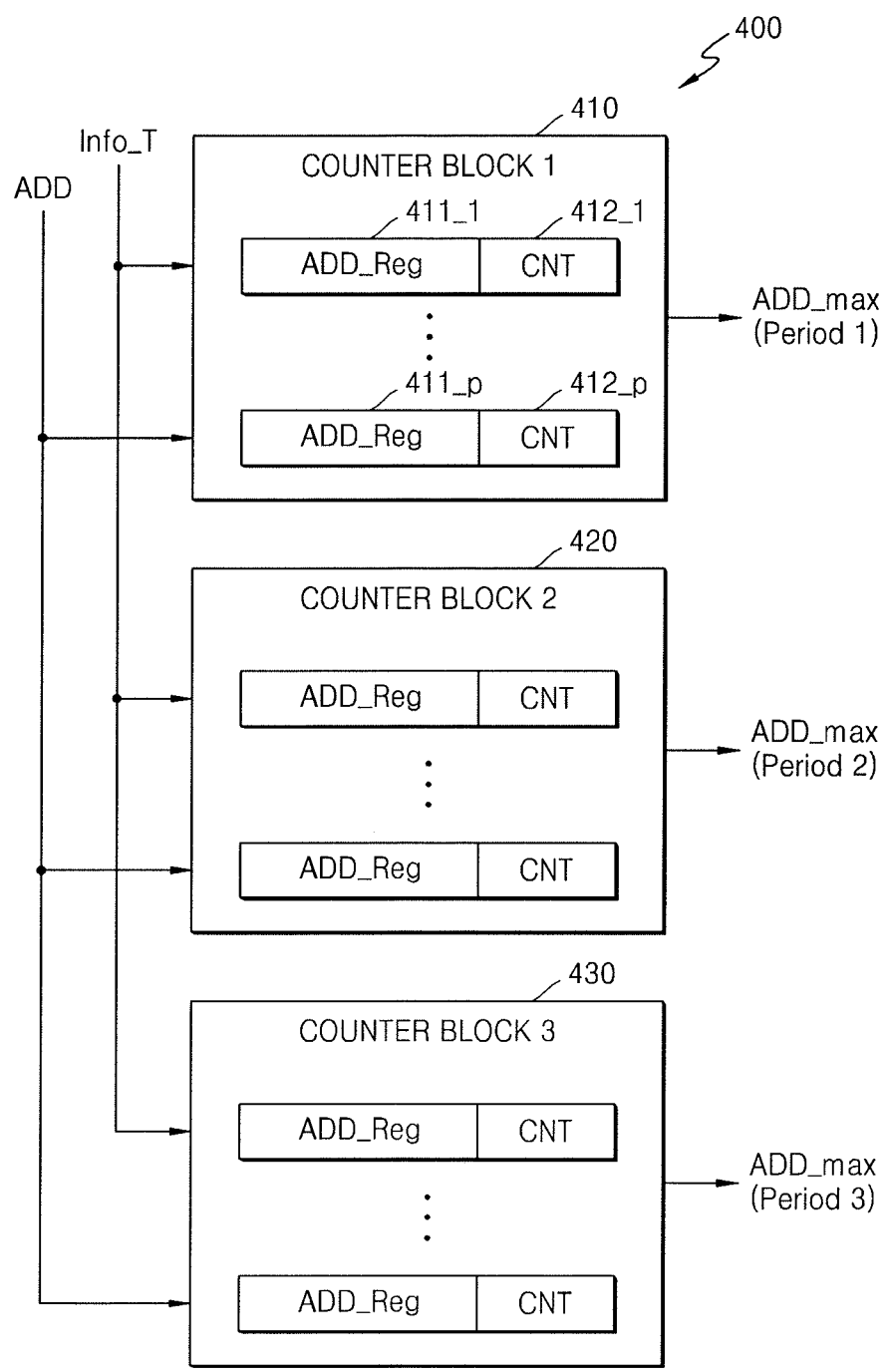
FIGS. 9 and 10 illustrate an embodiment of an access number determiner.
Figure 10:
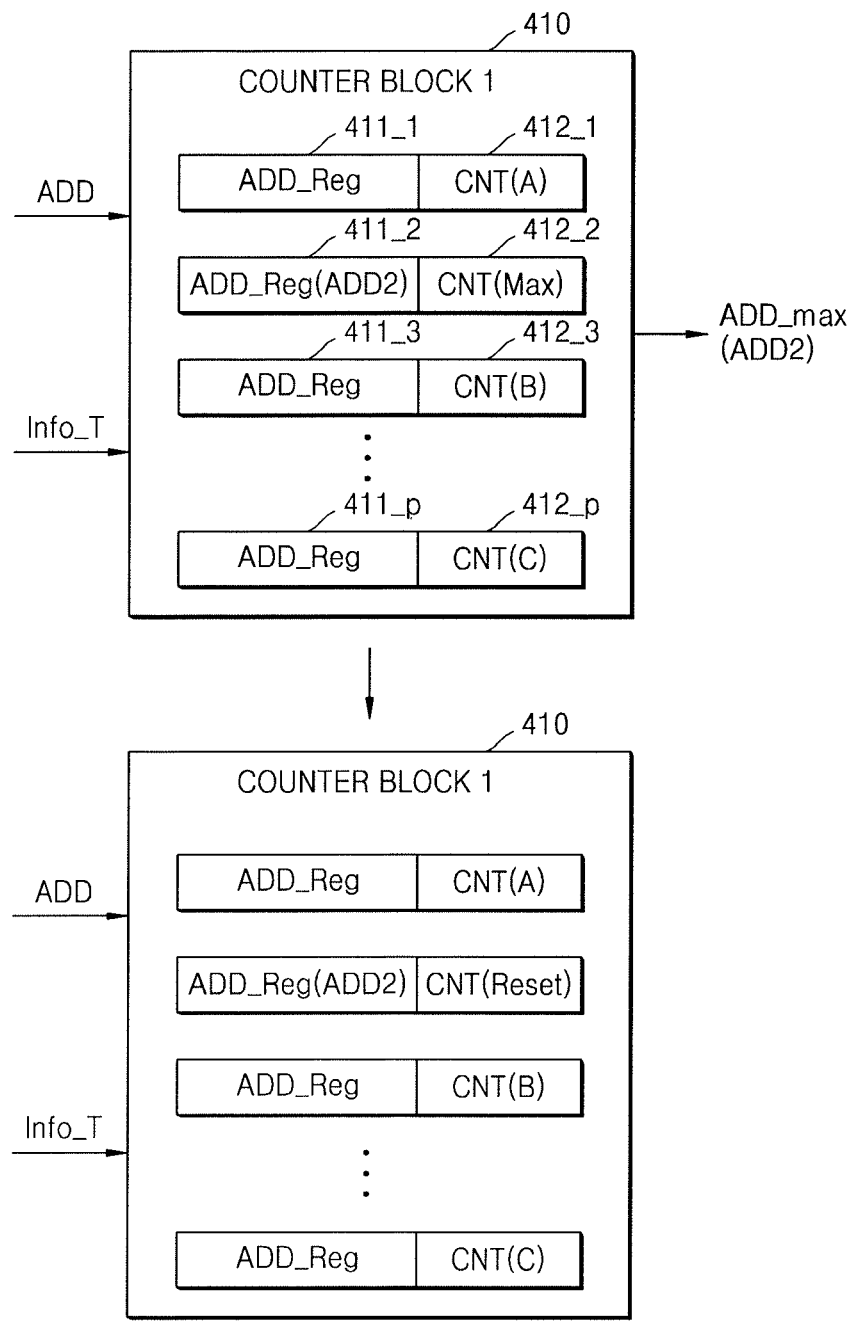

FIGS. 9 and 10 illustrates an embodiment of an access number determiner 400. Referring to FIG. 9, the access number determiner 400 may include first to third counter blocks 410 to 430. Each of the first to third counter blocks 410 to 430 may include a plurality of address registers and a plurality of counters corresponding thereto. Also, an address ADD indicating an accessed row and period information Info_T including information about a plurality of periods may be provided to each of the first to third counter blocks 410 to 430.

The first counter block 410 may count the number of accesses of rows during a first period Period 1 and may output an address of a row (which is accessed the most during the first period Period 1) as a maximum access address ADD_max. Similarly, the second counter block 420 may count the number of accesses of rows during a second period Period 2 and may output an address of a row (which is accessed the most during the second period Period 2) as a maximum access address ADD_max. Also, the third counter block 430 may count the number of accesses of rows during a third period Period 3 and may output an address of a row (which is accessed the most during the third period Period 3) as a maximum access address ADD_max.

An embodiment of a counter block will be described below with reference to the first counter block 410. The first counter block 410 may include a plurality of address registers 411_1 to 411_p and a plurality of counters 412_1 to 412_p corresponding thereto. The number of the address registers 411_1 to 411_p may be equal to or less than the number of rows in a memory cell array. In an embodiment, some rows in the memory cell array that are frequently accessed may be selected as candidate rows through a certain algorithm. Addresses of the selected candidate rows may be stored in the address registers 411_1 to 411_p. Also, based on an address ADD provided to the first counter block 410, a counter corresponding to an address register storing the same address as the provided address ADD may perform a counting operation.

FIG. 10 illustrates an embodiment of a counting operation of the access number determiner 400 in FIG. 9. An example of a counting operation will be described below with reference to the first counter block 410.

The first counter block 410 may determine a row which is accessed the most during a first period. For example, during the first period, a second row corresponding to a second address ADD 2 may be the most accessed, the number of accesses of a row corresponding to an address stored in a first address register 411_1 may be A, the number of accesses of a row corresponding to an address stored in a third address register 411_3 may be B, and the number of accesses of a row corresponding to an address stored in a pth address register 411_p may be C. Therefore, the first counter block 410 may output the second address ADD 2, stored in a second address register 411_2, as a maximum access address ADD_max. Accordingly. a care refresh operation may be performed on rows (for example, ±1 adjacent rows) that are most adjacent to the second row.

Subsequently, a value of the counter 412_2 corresponding to the second address register 411_2 may be reset, and a row which is accessed the most during a next first period may be determined again. At this time, since a care refresh operation is not performed on rows adjacent to rows other than the second row, counting values of counters respectively corresponding to the other address registers 411_1 and 411_4 to 411_p may be maintained without being reset. For example, when a next first period starts, a counting value corresponding to the third address register 411_3 may have a value B and a counting operation may start. When a counting value of the counter 412_3 corresponding to the third address register 411_3 is greatest during a next first period, the first counter block 410 may output a third address ADD 3 as a maximum access address ADD_max in the next first period.

Figure 11A:
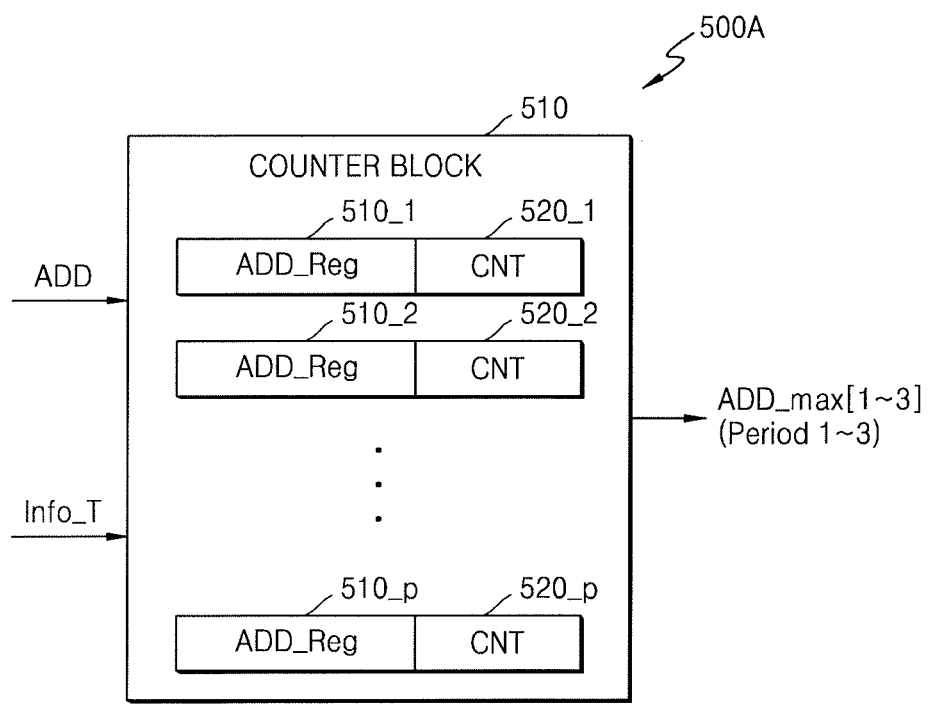
FIGS. 11A and 11B illustrate other embodiments of access number determiner.
Figure 11B:
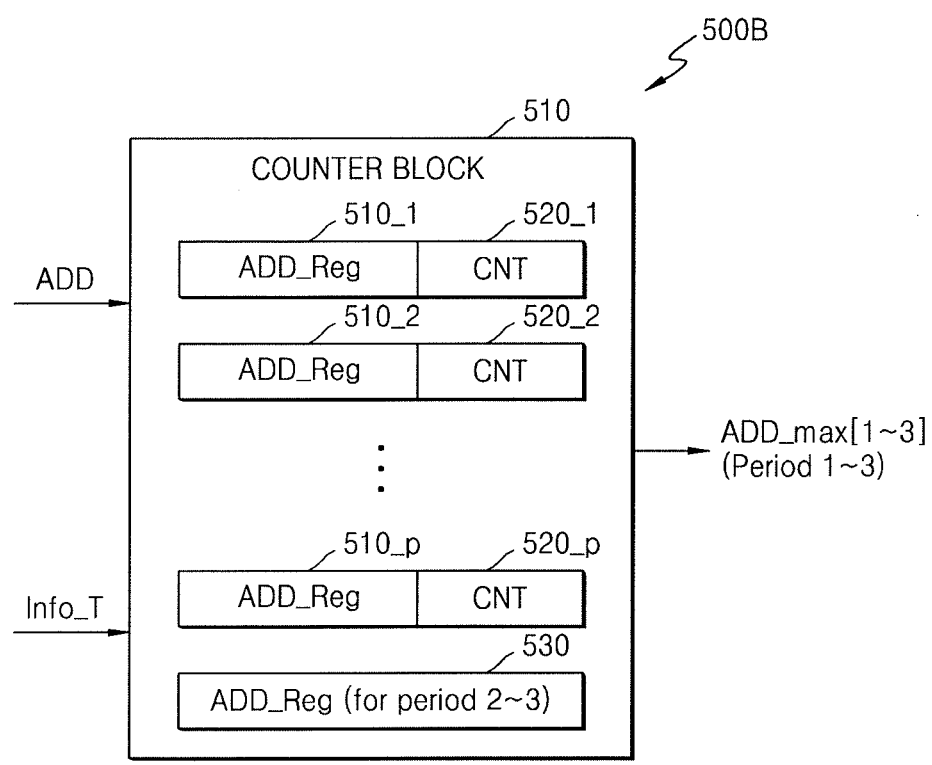

FIGS. 11A and 11B illustrates another embodiment of an access number determiner 310. In FIGS. 11A and 11B, one counter block shares counting operations respectively corresponding to a plurality of periods. Also, for convenience of description, FIGS. 11A and 11B illustrate first to third periods Period 1 to Period 3.

Referring to FIG. 11A, the access number determiner 310 may include a counter block 500A which is shared in determining a maximum access address ADD_max corresponding to a plurality of periods. The counter block 500A may include a plurality of address registers 510_1 to 510_p and a plurality of counters 520_1 to 520_p corresponding thereto.

Similarly to the above-described embodiments, the counter block 500A may determine a row which is accessed the most during a first period and may output a maximum access address ADD_max1 based on a result of the determination. A care refresh operation may be performed on ±1 adjacent rows of the maximum access address ADD_max1, and a counting value of a corresponding counter may be reset.

The maximum access address ADD_max1 based on a counting result corresponding to a plurality of first periods may be output. When a second period arrives, the counter block 500A may output a maximum access address ADD_max2 for performing a care refresh operation on ±2 adjacent rows. According to an embodiment, the maximum access address ADD_max2 may be determined by checking counting values of the counters 520_1 to 520_p at a time when the second period arrives. For example, at the time when the second period arrives, an address corresponding to a counter having a greatest counting value may be output as the maximum access address ADD_max2. Similarly, the counter block 500A may check the counting values of the counters 520_1 to 520_p at a time when a third period arrives. Based on the counting values, the counter block 500A may output a maximum access address ADD_max3 for performing a care refresh operation on ±3 adjacent rows.

FIG. 11B illustrates another embodiment of a counter block 500B which may further include an address register 530 along with the elements illustrated in FIG. 11A. Identically or similarly to the above-described embodiment, the counter block 500B may output maximum access addresses ADD_max1 to 3 respectively corresponding to first to third periods Period 1 to Period 3.

According to an embodiment, the counter block 500B may determine a row which is accessed the most during a first period and may output the maximum access address ADD_max1 based on a result of the determination. Also, a second period may arrive after a plurality of first periods elapse. Thus, at a time when the maximum access address ADD_max2 corresponds to the second period, there may be a determination result which is performed in the plurality of first periods preceding the time.

According to an embodiment, an address corresponding to one or more maximum address rows which are determined in the plurality of first periods may be output as the maximum access address ADD_max2 in the second period. For example, in an intensively accessed row, a care refresh operation may be first performed on ±1 adjacent rows, and then a care refresh operation may be performed on ±2 adjacent rows. Therefore, in the present embodiment, at a time when the second period arrives, one or more rows where ±1 adjacent rows have been subject to a care refresh operation may be selected before the time, and an address corresponding to the selected row may be output as the maximum access address ADD_max2 in the second period.

According to an embodiment, an arbitrary maximum access row of a plurality of maximum access rows which are determined in the first periods may be selected as a maximum access row in the second period. For example, a row which is first determined as a maximum access row in the plurality of first periods may be determined as a maximum access row in the second period. In one embodiment, a maximum access row which is determined in a first period, corresponding to a certain order, of the plurality of periods may be determined as a maximum access row in the second period, or a maximum access row which is determined in a last first period may be determined as a maximum access row in the second period.

In one embodiment, a counting value of a counter corresponding to a maximum access row which is determined at every first period may be reset, and a counting operation may be performed on reset maximum access rows according to an address ADD for which access is subsequently requested. Counting values of rows which are determined as maximum access rows in preceding first periods may be compared with each other at a time when the second period arrives. A row having the greatest counting value of the counting values may be determined as a maximum access row in the second period.

The address register 530 of FIG. 11B may store addresses of one or more rows which are to be determined as maximum access rows in the second period and/or the third period. For example, the address register 530 may include one or more registers which store addresses of one or more rows. For example, an address corresponding to one of the maximum access rows which are determined in the plurality of first periods may be stored in the address register 530. At a time when the second period arrives, the address stored in the address register 530 may be output as a maximum access address ADD_max2.

Similarly, a maximum access address ADD_max3 may be output from the counter block 500B in the third period. For example, the maximum access address ADD_max2 may be output at every second period, and a maximum access address which is determined in one second period may be output as the maximum access address ADD_max3 in the third period.

Figure 12A:
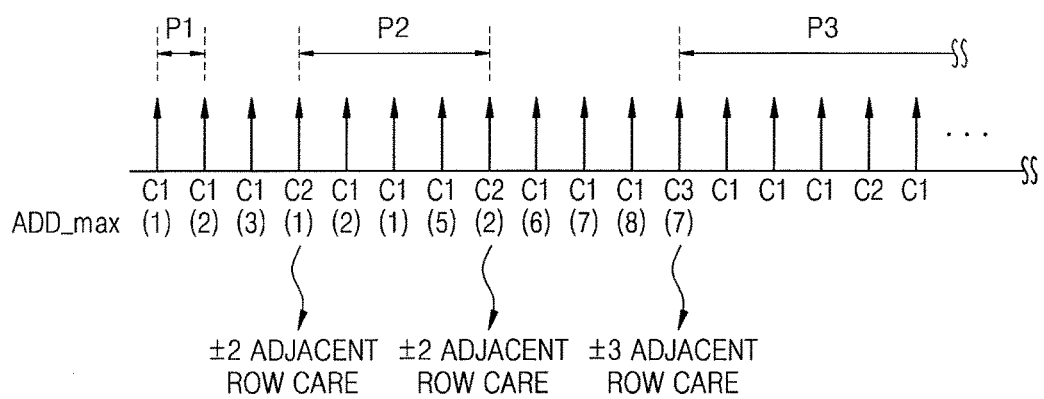
FIGS. 12A and 12B illustrate other embodiments of a refresh operation.
Figure 12B:
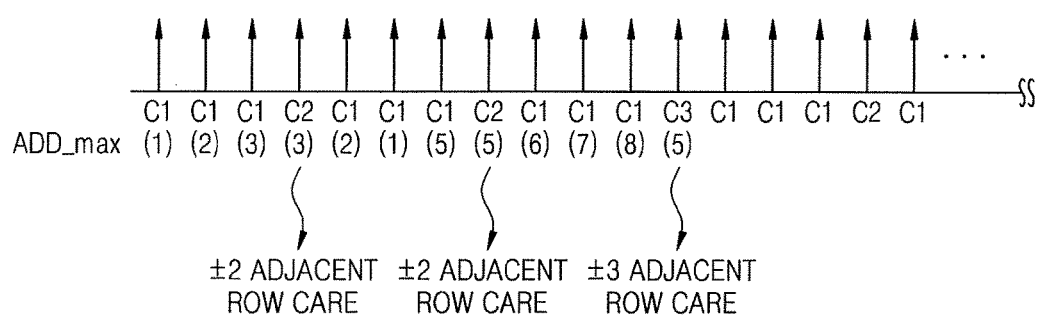

FIGS. 12A and 12B illustrate embodiments of a refresh operation by a counter block in FIGS. 11A and 11B. In these embodiments, a care refresh operation is performed on ±1 adjacent rows, ±2 adjacent rows, and ±3 adjacent rows according to first to third periods.

Referring to FIG. 12A, a care refresh operation C1 may be successively performed on a plurality of ±1 adjacent rows, and a care refresh operation C2 may be performed on ±2 adjacent rows according to a certain period. When a three-time care refresh operation C1 is performed on the ±1 adjacent rows and then a care refresh operation C2 is performed on the ±2 adjacent rows, and when first to third rows (1 to 3) are sequentially determined as maximum access rows in a three-time first period P1, the first row (1) which is first determined may be determined as a maximum access row in a subsequent second period P2. Also, when second, first, and fifth rows (2, 1, and 5) are sequentially determined as maximum access rows in a next three-time first period P1, the second row (2) may be determined as a maximum access row in a subsequent second period P2.

Similarly, when a third period P3 arrives, one of the maximum access rows which are selected in a plurality of preceding second periods P2 may be determined as a maximum access row in the third period P3. In the embodiment of FIG. 12A, an example where the first row (1) which is first selected in a plurality of second periods P2 is determined as a maximum access row in the third period P3 subsequent to the second period P2 is illustrated.

Referring to FIG. 12B, an example is illustrated where a maximum access row, which is determined in a last first period P1 of a plurality of first periods P1, is determined as a maximum access row in a subsequent second period P2. Also, a maximum access row which is determined in a last second period P2 of a plurality of second periods P2 may be determined as a maximum access row in a subsequent third period P3. As shown in FIG. 12B, when first to third rows (1 to 3) are sequentially determined as maximum access rows in the plurality of first periods P1, the third row (3), which is last determined, may be determined as a maximum access row in a subsequent second period P2. Also, when second, first, and fifth rows (2, 1, and 3) are sequentially determined as maximum access rows in the plurality of first periods P1, the fifth row (5) may be determined as a maximum access row in a subsequent second period P2.

Figure 13A:
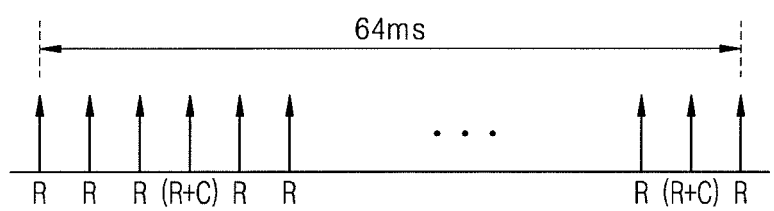
FIGS. 13A-13C illustrate embodiments of a refresh period for a care refresh operation.
Figure 13B:
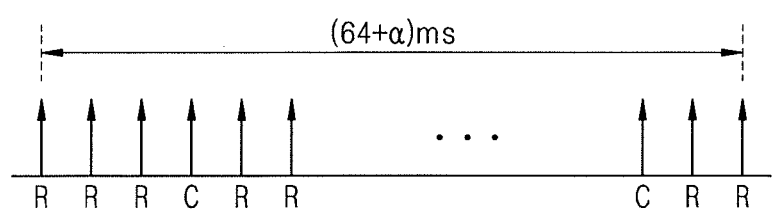
Figure 13C:
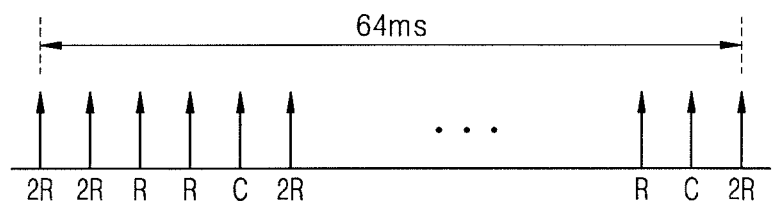

FIGS. 13A-13C illustrate embodiments of a refresh period when a care refresh operation is applied. FIGS. 13A-13C illustrate embodiments where a refresh interval is 15.6 μs, the total number of rows is 4096, and a refresh period is 64 ms. These values correspond to one type of refresh standard of a DRAM. The care refresh operation may be performed based on different values in other embodiments.

According to an embodiment, a normal refresh operation R may be sequentially performed according to the refresh interval. When a period for performing a care refresh operation C arrives, the normal refresh operation and the care refresh operation may be simultaneously performed (R+C) at a certain refresh time. Since the normal refresh operation and the care refresh operation are simultaneously performed at a time when the care refresh operation is performed, the refresh period may be maintained as 64 ms and the care refresh operation may be performed. The care refresh operation C may be a refresh operation in one of the plurality of periods in accordance with one or more other embodiments described herein.

Referring to FIG. 13B, a normal refresh operation R may be sequentially performed according to the refresh interval. When a period for performing a care refresh operation C arrives, the care refresh operation C may be performed. At this time, the refresh period may increase by a time a. more than 64 ms based on the number of times the care refresh operation C is performed in one refresh period.

Referring to FIG. 13C, a normal refresh operation R may be sequentially performed according to the refresh interval. For example, two or more rows may be simultaneously refreshed for at least some of a plurality of times for which the normal refresh operation R is performed. Also, when a period for performing the care refresh operation arrives, the care refresh operation C may be performed. By controlling the number of rows which are refreshed at one refresh time, the refresh period may be maintained as 64 ms and the care refresh operation may be performed.

Figure 14:
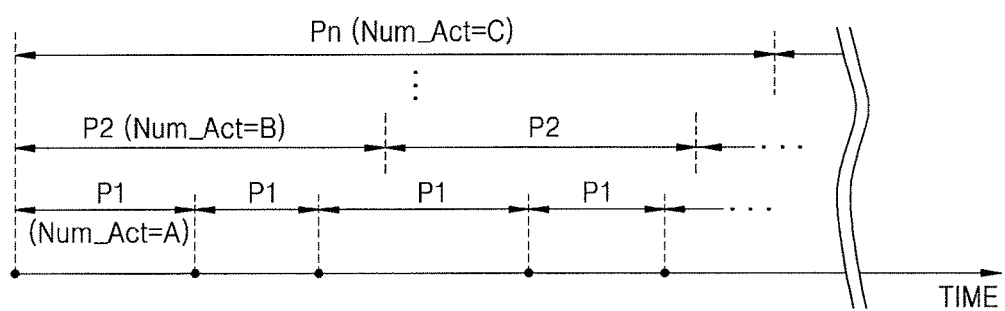
FIG. 14 illustrates embodiments of periods for a care refresh operation.

FIG. 14 illustrates an embodiment for setting periods for performing a care refresh operation. In the above-described embodiment, an example is illustrated where first to nth periods P1 to Pn for performing a care refresh operation are set with respect to a time. However, in the embodiment of FIG. 14, each of the first to nth periods may be set based on the number of times commands are applied (or the number of activations).

According to an embodiment, the first period P1 may be a period corresponding to a relatively smaller number of activations, but the nth period Pn may be a period corresponding to a relatively larger number of activations. For example, a row which is accessed the most in the number A of activations may be determined and a care refresh operation may be performed on ±1 adjacent rows based on a result of the determination. Also, a row which is accessed the most in the number B of activations may be determined and a care refresh operation may be performed on ±2 adjacent rows based on a result of the determination. Also, a row which is accessed the most in the number C of activations may be determined and a care refresh operation may be performed on ±3 adjacent rows based on a result of the determination. The value of A may be relatively smaller than the value of B or C. Thus, the first period P1 may have a time interval which is shorter than those of the second to nth periods P2 to Pn. Also, commands may be aperiodically applied. Thus, despite the same period (for example, the first period P1), a previous first period P1, and a next first period P1 may be different time intervals.

Figure 15:
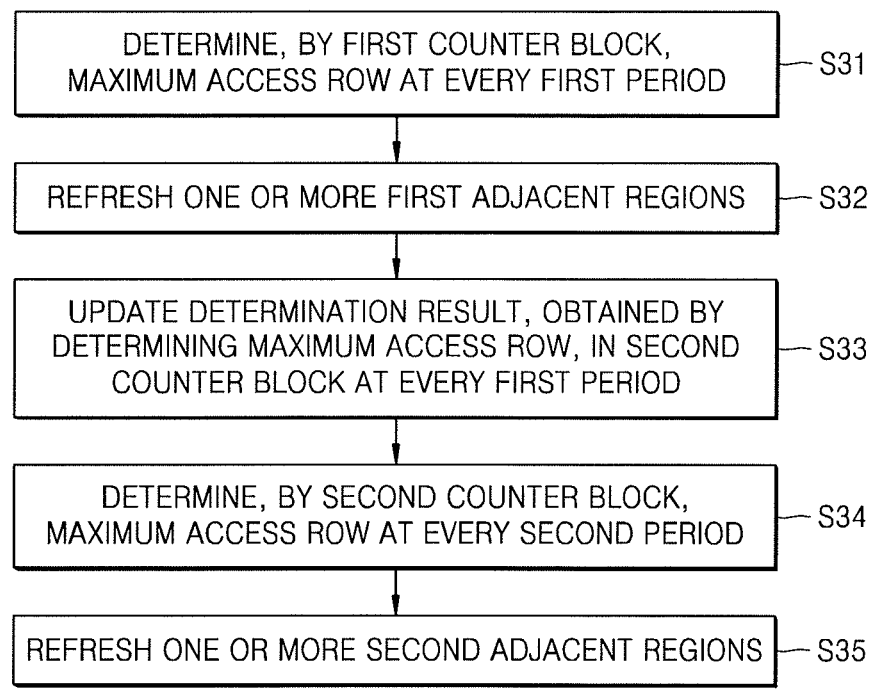
FIG. 15 illustrates another embodiment of a method for operating a memory device.

FIG. 15 illustrates another embodiment of a method for operating a memory device. Referring to FIG. 15, the memory device may include a plurality of counter blocks for determining a row which is accessed the most in each of a plurality of periods. The counter blocks may generate a counting result according to different counting operations. In FIG. 15, for convenience of description, a first counter block for determining a row which is accessed the most in a first period and a second counter block for determining a row which is accessed the most in a second period will be described as an example.

The first counter block may include a plurality of address registers and a plurality of counters corresponding thereto. The first counter block may determine a maximum access row at every first period based on a counting operation, and for example, perform the counting operation using an address from the outside in operation S31. In operation S32, the memory device may refresh one or more first adjacent regions (for example, ±1 adjacent rows) based on a result of the determination by the first counter block.

In operation S33, a determination result based on a maximum access row which is generated by the first counter block at every first period may be updated in the second counter block. For example, when the first counter block determines a first row as a maximum access row in one first period, a counting value corresponding to an address register storing the first row may increase in the second counter block. For example, when an address of the first row is not stored in the second counter block, the address of the first row may be stored in one address register of the second counter block, and a counting value corresponding to the stored address may increase.

Based on a counting result of the second counter block, the second counter block may determine a maximum access row at every second period in operation S34. For example, when the second period has a period which is D times longer than the first period, the second counter block may perform a D-time counting operation at every second period. The second counter block may determine a maximum access row based on a result of the D-time counting operation and the memory device may refresh one or more second adjacent regions (for example, ±2 adjacent rows) based on a determination result of the second counter block in operation S35.

According to the above-described embodiment, the number of times counting performed by the second counter block is reduced. Thus, power consumed by the counter blocks of the memory device is reduced.

Figure 16:
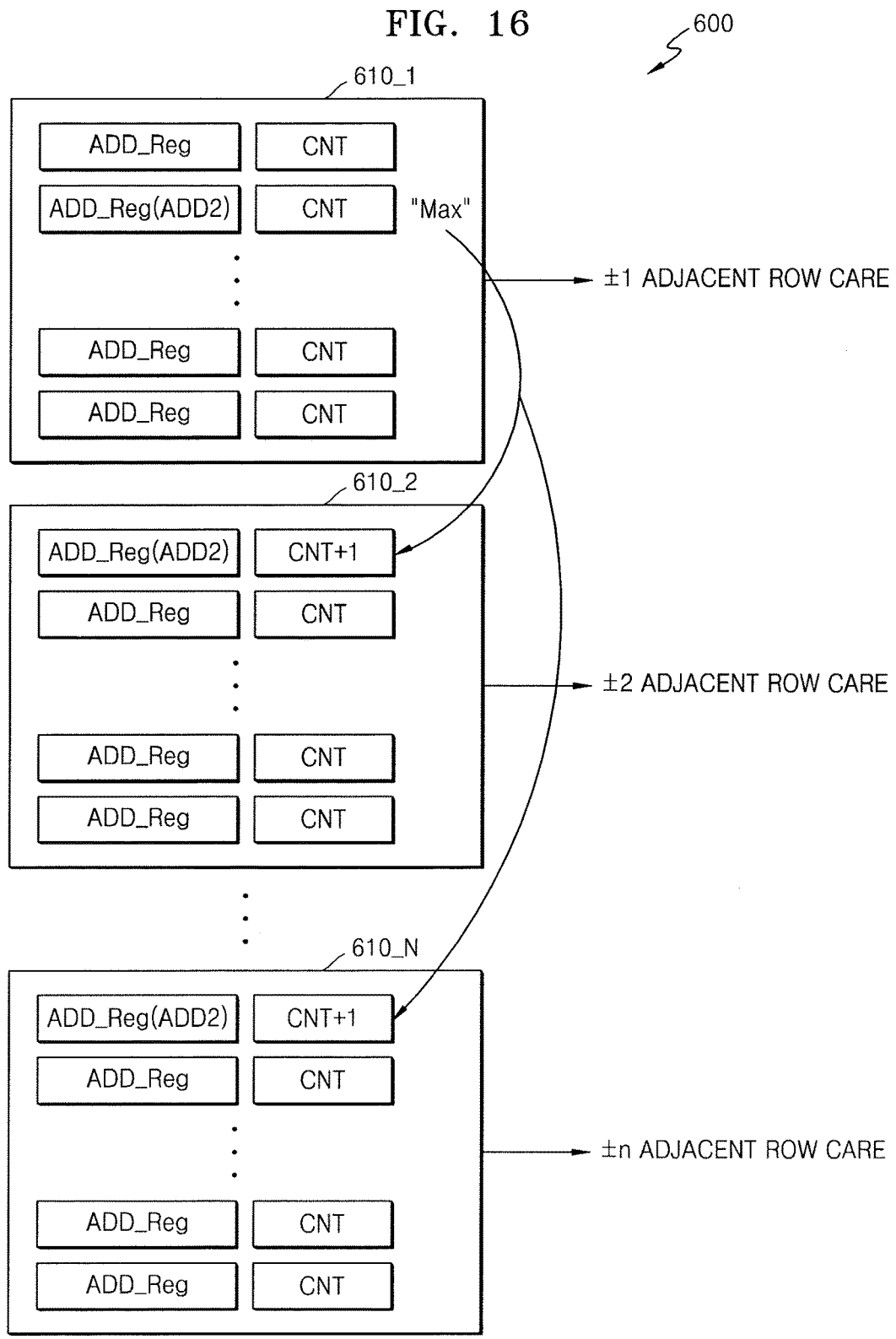
FIG. 16 illustrates another embodiment of an access number determiner.

FIG. 16 illustrates another embodiment of an access number determiner 600 performing a counting operation according to the embodiment of FIG. 15. Referring to FIG. 16, the access number determiner 600 may include first to Nth counter blocks 610_1 to 610_N. The first counter block 610_1 may determine a row which is accessed the most in a first period, and the Nth counter block 610_N may determine a row which is accessed the most in an nth period. Also, each of the first to Nth counter blocks 610_1 to 610_N may include a plurality of address registers and a plurality of counters corresponding thereto.

The first counter block 610_1 may determine a second row, corresponding to a second address ADD 2, as a maximum access row and may provide a result of the determination during the first period. Also, a care refresh operation may be performed on ±1 adjacent rows based on the determination result. Also, the determination result of the first counter block 610_1 may be updated in the second to Nth counter blocks 610_2 to 610_N. For example, since the second row is determined as the maximum access row, a counting value of a counter corresponding to an address register storing the second address ADD 2 may increase by one in each of the second to Nth counter blocks 610_2 to 610_N. Such an updating operation may be performed whenever a first period arrives.

When the second period arrives, the second counter block 610_2 may provide a result obtained by determining a maximum access row based on a counting result of the second counter block 610_2. Also, based on the counting result from the second counter block 610_2, a care refresh operation may be performed on ±2 adjacent rows of the maximum access row. For example, when a D-time first period corresponds to a period corresponding to one second period, the second counter block 610_2 may perform a D-time counting operation during the second period and may determine a maximum access row, based on the counting result.

Similarly, when the nth period arrives. the Nth counter block 610_N may provide a result obtained by determining a maximum access row based on a counting result of the Nth counter block 610_N. Also. a care refresh operation may be performed on ±n adjacent rows of the maximum access row based on the counting result from the Nth counter block 610_N. For example, when an E-time first period corresponds to a period corresponding to one nth period, the Nth counter block 610_N may perform an E-time counting operation during the nth period and may determine a maximum access row based on the counting result.

In FIG. 16, an example is illustrated where a determination result of the first counter block 610_1 is updated in the second to Nth counter blocks (or simply counters) 610_2 to 610_N. In other embodiments, a determination result of the first counter block 610_1 may be updated in the second counter block 610_2 and a determination result of the second counter block 610_2 may be updated in the third counter block 610_3. In this manner, a determination result of the N−1st counter block 610_(N−1) may be updated in the Nth counter block 610_N.

Figure 17:
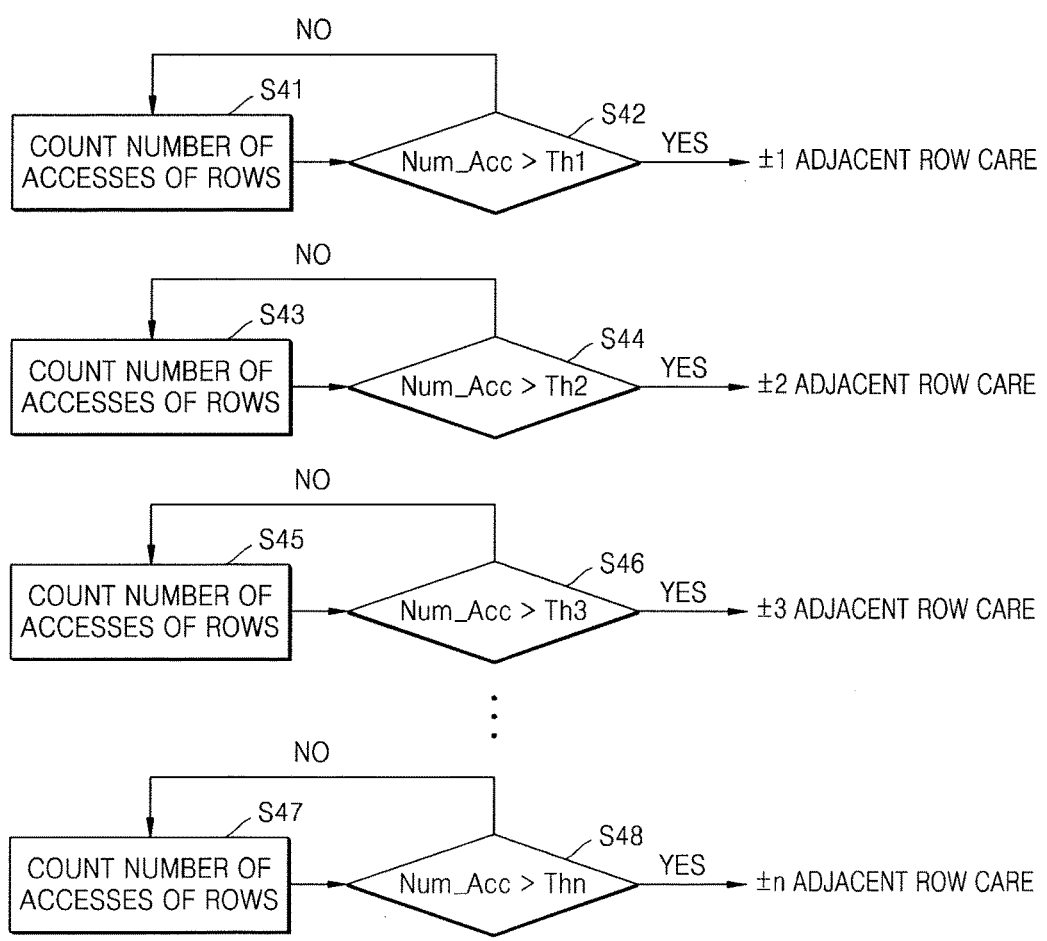
FIG. 17 illustrates another embodiment of a method for operating a memory device.

FIG. 17 illustrates another embodiment of a method for operating a memory device. According to this embodiment, in performing a care refresh operation on rows adjacent to an intensively accessed row, threshold values having different values may be set based on a degree of adjacency to the intensively accessed row. For example, a first adjacent row (for example, ±1 adjacent rows) that is most adjacent to the intensively accessed row may be large in degree to which the first adjacent row is disturbed. Thus, a first threshold value having a relatively small value may be set for the first adjacent row. When the number of accesses of the intensively accessed row reaches the first threshold value, a care refresh operation may be performed on the first adjacent row.

Also, a second adjacent row (for example, ±2 adjacent rows) that is second adjacent to the intensively accessed row may be smaller in a disturbed degree than the first adjacent row. Thus, a second threshold value having a relatively large value may be set for the second adjacent row. When the number of accesses of the intensively accessed row reaches the second threshold value, a care refresh operation may be performed on the second adjacent row.

Referring to FIG. 17, a first threshold value Th1 may be set as a care refresh condition of a first adjacent row and the number of accesses of rows may be counted in operation S41. Whether there is a row where a counting value is more than the first threshold value Th1 may be determined in operation S42. When it is determined that there is the row where the counting value is more than the first threshold value Th1, a counting operation may be continuously performed. When a counting value corresponding to a certain row is more than the first threshold value Th1, a care refresh operation may be performed on a first adjacent row adjacent to the certain row.

Similarly, a second threshold value Th2 may be set as a care refresh condition of a second adjacent row and the number of accesses of rows may be counted in operation S43. Whether there is a row where a counting value is more than the second threshold value Th2 may be determined in operation S44. When it is determined that there is the row where the counting value is more than the second threshold value Th2, a care refresh operation may be performed on a second adjacent row adjacent to the certain row. In this manner, an operation (S45) of counting the number of accesses of rows in association with a third adjacent row and an operation (S46) of determining whether a counting value corresponding to a certain row is more than a third threshold value Th3 may be performed. Moreover, an operation (S47) may be performed of counting the number of accesses of rows in association with an nth adjacent row and an operation (S48) of determining whether a counting value corresponding to a certain row is more than an nth threshold value Thn.

Figure 18A:
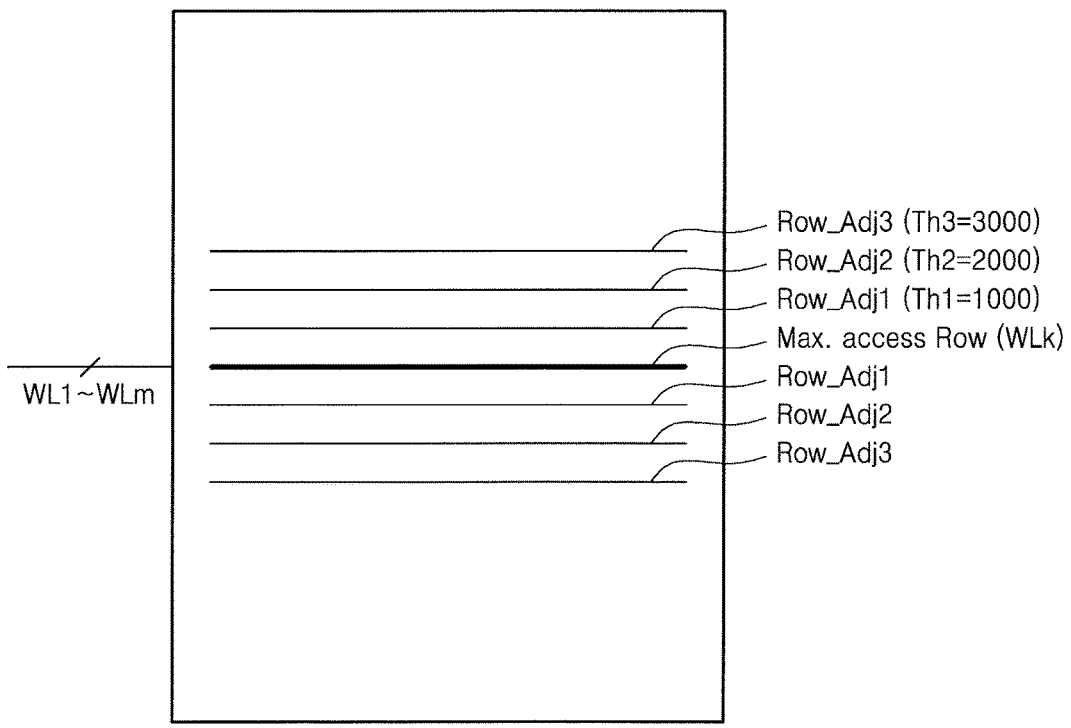
FIGS. 18A and 18B illustrate other embodiments of an access number determiner.
Figure 18B:
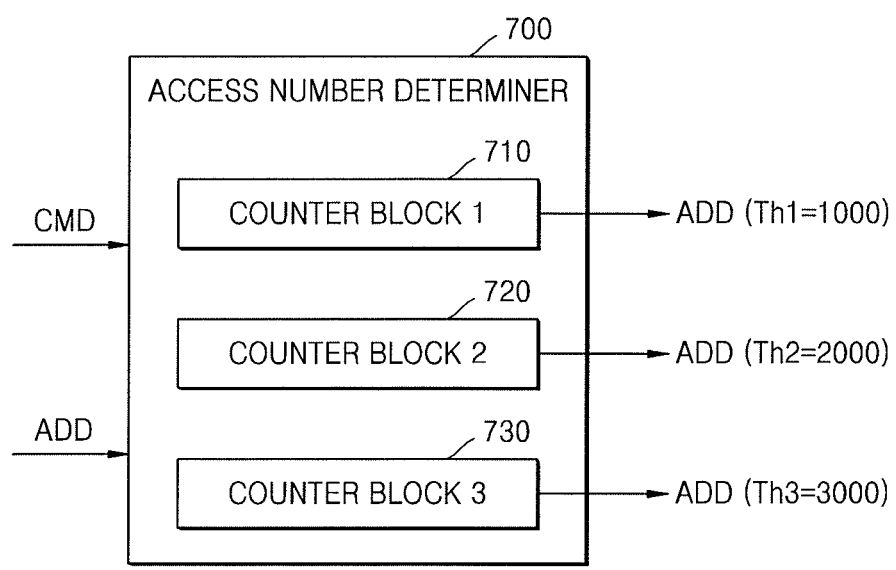

FIGS. 18A and 18B illustrate another embodiment of an access number determiner and an example where a threshold value is set for a plurality of adjacent rows. FIG. 18A illustrates three adjacent rows adjacent to an intensively accessed row (for example, a kth row). Also, an example is illustrated where a first threshold value Th1 for performing a care refresh operation on ±1 adjacent rows is set to 1,000, a second threshold value Th2 for performing a care refresh operation on ±2 adjacent rows is set to 2,000, and a third threshold value Th3 for performing a care refresh operation on ±3 adjacent rows is set to 3,00.

When the kth row is intensively accessed, adjacent rows adjacent to the kth row may be disturbed. Degrees to which the adjacent rows are disturbed may differ based on a degree of adjacency to the kth row. When the number of accesses of the kth row is more than 1,000, which is the first threshold value Th1, the ±1 adjacent rows may be largely disturbed. For this reason, data reliability may be reduced, but degrees to which the ±2 adjacent rows are disturbed may be still be small. Therefore, a care refresh operation may be first performed on the ±1 adjacent rows.

Subsequently, the kth row may be continuously and intensively accessed. Thus, the number of accesses of the kth row may be more than 2,000, which is the second threshold value Th2. Therefore, a care refresh operation may be performed on the ±2 adjacent rows. Similarly, the kth row may be continuously and intensively accessed. Thus, when the number of accesses of the kth row is more than 3,000, which is the third threshold value Th3, a care refresh operation may be performed on the ±3 adjacent rows.

Referring to FIG. 18B, an access number determiner 700 may include first to third counter blocks 710 to 730. The first counter block 710 may count the number of accesses of rows to output an address ADD of a row which is accessed by more than a first threshold value Th1. Similarly, the second counter block 720 may output an address ADD of a row which is accessed by more than a second threshold value Th2. The third counter block 730 may output an address ADD of a row which is accessed by more than a third threshold value Th3.

For example, when the number of accesses of a certain row is more than the first threshold value Th1, the first counter block 710 may output an address ADD corresponding to the number of accesses and may reset a counting value of the first counter block 710. Also, when the number of accesses of a certain row is more than the second threshold value Th2, the second counter block 720 may output an address ADD corresponding to the number of accesses and may reset a counting value of the second counter block 720. Also, when the number of accesses of a certain row is more than the third threshold value Th3, the third counter block 730 may output an address ADD corresponding to the number of accesses and may reset a counting value of the third counter block 730.

According to the above-described embodiment, a care refresh operation may not be periodically performed on adjacent rows. For example, when a plurality of rows of a memory cell array are equally accessed, a care refresh operation may not need to be performed in all instances. Thus, the care refresh operation may not be performed until the number of accesses is more than the first to third threshold values Th1 to Th3.

In one embodiment, when a plurality of rows of a memory cell array are equally accessed without being intensively accessed, there may not be a need to perform a care refresh operation. Therefore, a certain period may be set in each of the first to third counter blocks 710 to 730. When there is no row which is accessed by more than the first to third threshold values Th1 to Th3 during the set period, the present embodiment may be implemented by resetting a counting value of each of the first to third counter blocks 710 to 730.

Figure 19:
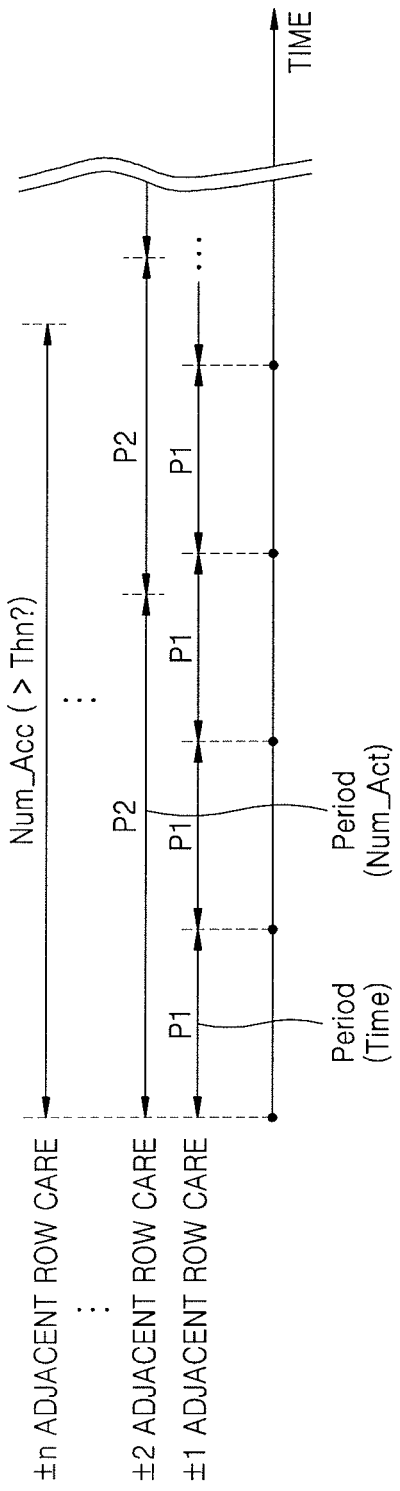
FIG. 19 illustrates another embodiment of periods for a care refresh operation.

FIG. 19 illustrates another embodiment for setting periods for performing a care refresh operation. In FIG. 19, an example is illustrated where care refresh conditions of a plurality of adjacent regions are set differently.

For example, a first period P1 may be set for performing a care refresh operation on a first adjacent region (for example, ±1 adjacent rows). A second period P2 may be set for performing a care refresh operation on a second adjacent region (for example, ±2 adjacent rows). For example, the first period P1 may be a period having a certain time interval according to the above-described embodiments. Accordingly, a care refresh operation may be performed on a first adjacent region of a row which is accessed the most during the first period P1.

The second period P2 may be, for example, a period corresponding to the number of applications of a certain command (or the number of activations) according to the above-described embodiments. Accordingly, a care refresh operation may be performed on a second adjacent region of a row which is accessed the most during the second period P2. Also, time intervals of a plurality of second periods P2 may differ.

A certain threshold value Thn may be set for performing a care refresh operation on an nth adjacent region (for example, ±n adjacent rows). When the number of accesses of a certain row is more than the threshold value Thn, a care refresh operation may be performed on the nth adjacent region of the certain row.

Figure 20:
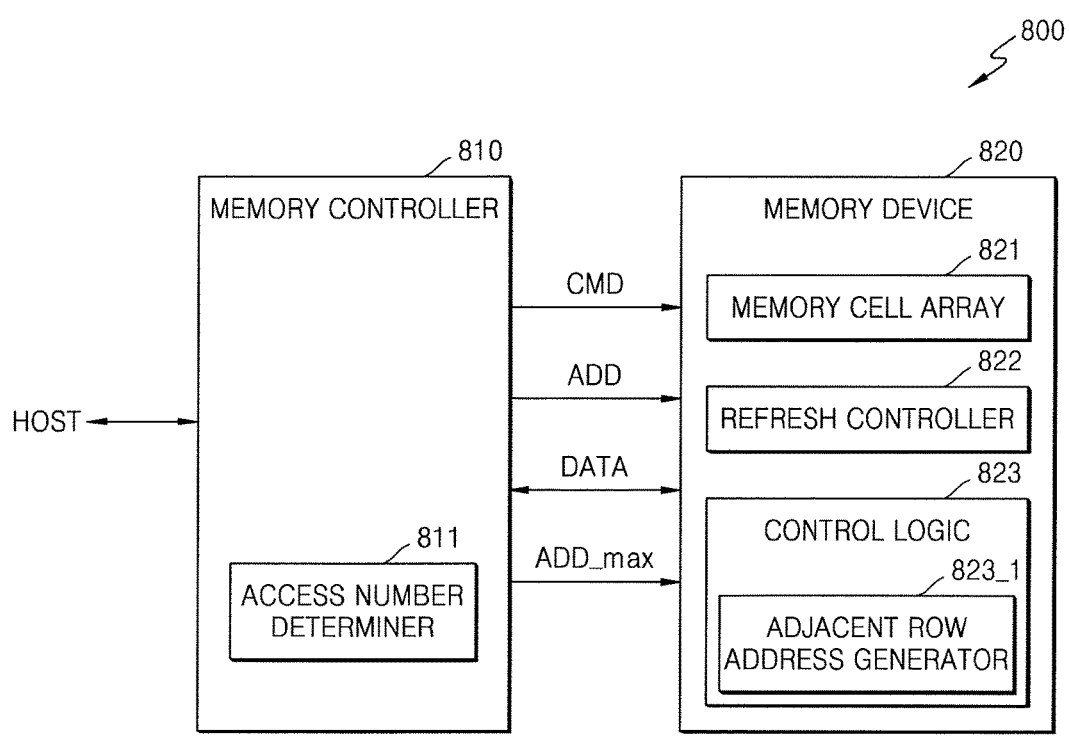
FIG. 20 illustrates an embodiment of a memory system.

FIG. 20 illustrates an embodiment of a memory system 800 which may include a memory controller 810 and a memory device 820. The memory device 820 may include a memory cell array 821, a refresh controller 822, and a control logic 823. Also, the memory controller 810 may include an access number determiner 811, and the control logic 823 may include an adjacent row address generator 823_1.

At least some of various counting operations, determination operations, and adjacent row address generating operations according to the above-described embodiments may be performed by the memory controller 810. In the embodiment of FIG. 20, an example is illustrated where the memory controller 810 counts the number of accesses of rows to provide the memory device 820 with an address (for example, a maximum access address ADD_max) of a row which is most accessed. For example, the present embodiment may be implemented so that the memory controller 810 generates an address of an adjacent row and provides the address to the memory device 820.

The access number determiner 811 may provide the memory device 820 with a maximum access address ADD_max which is determined for each of a plurality of periods. The access number determiner 811 may perform a counting operation using an address provided from a host HOST. Also, the adjacent row address generator 823_1 may generate adjacent row addresses having different degrees of adjacency in the plurality of periods. For example, according to the above-described embodiments, the adjacent row address generator 823_1 may generate an address corresponding to ±1 adjacent rows of the maximum access address ADD_max in a first period and may generate an address corresponding to ±2 adjacent rows of the maximum access address ADD_max in a second period.

The refresh controller 822 may perform a normal refresh operation using a counting address generated by the refresh controller 822, and may perform a care refresh operation using the adjacent row address generated by the adjacent row address generator 823_1.

Figure 21:
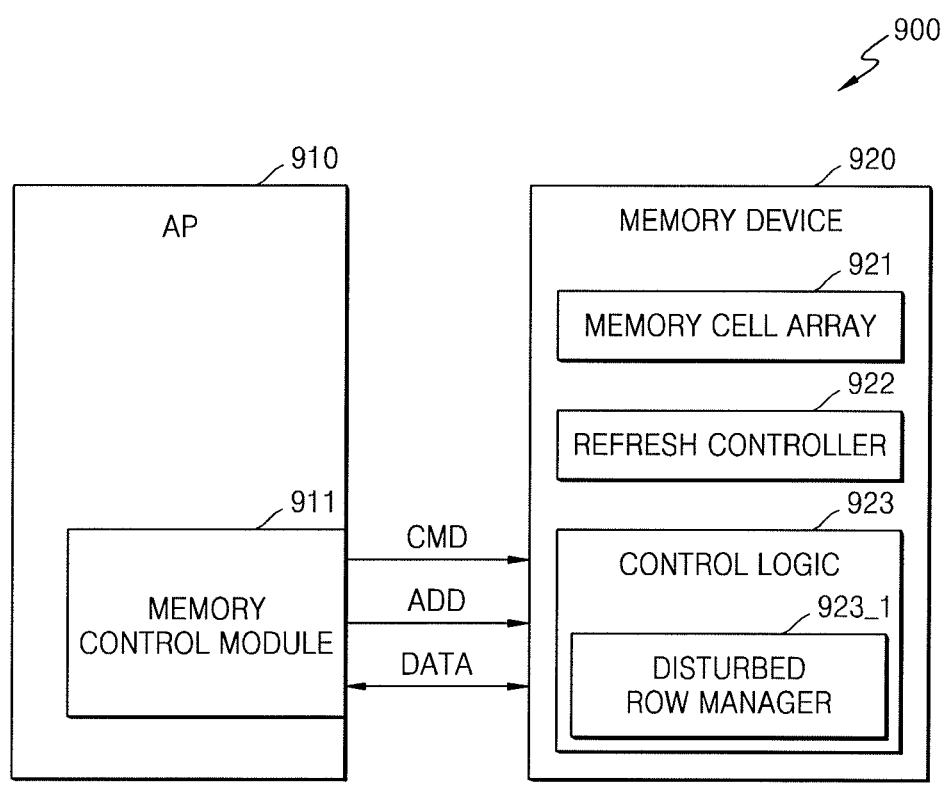
FIG. 21 illustrates an embodiment of a data processing memory system.

FIG. 21 illustrates an embodiment of a data processing system 900 which includes an application processor 910 and a memory device 920. A memory control module 911 of the application processor 910 and a memory device 920 may configure a memory system. The memory device 920 may include a memory cell array 921, a refresh controller 922, and a control logic 923. The control logic 923 may include a disturbed row manager 923_1.

The application processor 910 may be implemented, for example, as a system-on chip (SoC). The SoC may include a system bus to which a protocol based on certain bus standard is applied, and may include various intellectual property (IP) protected or proprietary software modules and/or hardware connected to the system bus. One example of a standard protocol of the system bus is Advanced microcontroller bus architecture (AMBA) protocol of Advanced RISC Machine (ARM). A bus type of the AMBA protocol may include advanced high-performance bus (AHB), advanced peripheral bus (APB), AXI, AX14, AXI coherency extensions (ACE). and/or the like. In addition, other types of protocols such as nNetwork of SONICs Inc., CoreConnect of IBM, open core protocol of OCP-IP, and/or the like, may be applied to the system bus.

The memory device 920 may perform various functions associated with a care operation (for example, a care refresh operation) according to the above-described embodiments. For example, the disturbed row manager 923_1 may count the number of accesses of rows, determine a maximum access row for each of a plurality of periods which are set, and detect a plurality of disturbed rows having different degrees of adjacency to the determined row. Also, the care operation may be performed on the detected plurality of disturbed rows based on different methods.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The controllers, managers, counters, determiners, generators, blocks, modules, and other signal generating and signal processing features of the disclosed embodiments may be implemented in logic which, for example, may include hardware, software, or both. When implemented at least partially in hardware, the controllers, managers, counters, determiners, generators. blocks, modules, and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, managers, counters, determiners, generators, blocks, modules, and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

In accordance with one or more of the aforementioned embodiments, a memory device and method for operating a memory may set a plurality of adjacent regions based on a degree of adjacency (or proximity) to an intensively accessed row. A care operation may then be performed differently on the set adjacent regions. An optimized care operation may therefore be performed according to a degree to which an adjacent region is disturbed.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features. characteristics, and/or elements described in connection with other embodiments unless otherwise indicated. Accordingly, various changes in form and details may be made without departing from the spirit and scope of the embodiments set forth in the claims.

What is claimed is:

1. A memory device, comprising:
a memory cell array including a plurality of rows;
a refresh controller to perform a refresh operation on the plurality of rows; and
a control logic to control a care operation on a first adjacent region that is most adjacent to a first row based on a number of times the plurality of rows are accessed during a first period and to control the care operation on a second adjacent region that is second adjacent to a second row based on a number of times the plurality of rows are accessed during a second period, wherein the first and second periods have different lengths and overlap each other.

2. The memory device as claimed in claim 1, wherein:
the first row is a row which is most accessed during the first period,
the second row is a row which is most accessed during the second period, and
the second period is longer than the first period.

3. The memory device as claimed in claim 1, wherein each of the first adjacent region and the second adjacent region include one or more adjacent rows.

4. The memory device as claimed in claim 3, wherein:
the first adjacent region includes ±1 adjacent rows upward and downward most adjacent to the first row, and
the second adjacent region includes ±2 adjacent rows upward and downward second adjacent to the second row.

5. The memory device as claimed in claim 1, wherein the care operation is a care refresh operation to be performed on one or more adjacent rows in the first adjacent region or the second adjacent region.

6. The memory device as claimed in claim 1, wherein the control logic includes:
   an access number logic including a first counter to count the number of accesses of the plurality of rows during the first period to output an address of the first row which is most accessed, and a second counter to count the number of accesses of the plurality of rows during the second period to output an address of the second row which is most accessed; and
   an adjacent row address generator to generate an address of each row in the first adjacent region based on a counting result of the first counter and to generate an address of each row in the second adjacent region based on a counting result of the second counter.

7. The memory device as claimed in claim 6, wherein:
   each of the first counter and the second counter includes a plurality of address registers and a plurality of counters respectively corresponding to the plurality of address registers,
   the care operation is to be performed on the first adjacent region, and then a counting value of a counter corresponding to an address register that is to store an address of the first row is reset in the first counter, and
   the care operation is to be performed on the second adjacent region, and then a counting value of a counter corresponding to an address register that is to store an address of the second row is reset in the second counter.

8. The memory device as claimed in claim 6, wherein:
   a counting result of the first counter is to be updated in the second counter at every first period, and
   the second counter is to increase a counting value of a counter corresponding to a row determined to be most accessed by one at every first period.

9. The memory device as claimed in claim 1, wherein the control logic includes:
   a counter to determine a row which is most accessed in each of a plurality of first periods, to output an address corresponding to the determined row, and to output, when the second period arrives, an address of one of rows which are determined in the plurality of first periods.

10. The memory device as claimed in claim 1, wherein the control logic is to:
    determine a row which is most accessed during each of third to nth periods (where n is an integer equal to or more than three), and
    control the care operation on adjacent regions having different degrees of adjacency to rows which are determined in the third to nth periods.

11. The memory device as claimed in claim 1, wherein each of the first period and the second period includes a certain time period which is set or a period where a certain number of commands are applied.

12. A method for operating a memory device, including a memory cell array which includes a plurality of rows and first to nth adjacent regions (where n is an integer equal to or more than two) that are based on a degree of adjacency to a first row, the method comprising:
    performing a counting operation on number of accesses of the plurality of rows to determine an intensively accessed row;
    selecting one adjacent region from among the first to nth adjacent regions based on a condition of performing the counting operation;
    performing a care refresh operation on one or more rows in the selected one adjacent region;
    setting first to nth threshold values, the first threshold value being smaller than the nth threshold value;
    wherein performing the care refresh operation includes selecting the first adjacent region when number of accesses of the first row is determined to be greater than the first threshold value, and selecting the nth adjacent region when the number of accesses of the first row is determined to be greater than the nth threshold value.

13. The method as claimed in claim 12, wherein selecting the one adjacent region includes outputting an address of each of the one or more rows in the selected one adjacent region as a refresh address.

14. The method as claimed in claim 12, wherein the first row is most accessed during a certain set period.

15. The method as claimed in claim 12, wherein:
    the memory device includes first to Nth counter blocks (where N is an integer equal to or more than two) respectively corresponding to the first to nth adjacent regions, and the method includes:
    under the performing condition, selecting the first adjacent region when the counting operation is performed by the first counter block and selecting the nth adjacent region when the counting operation is performed by the Nth counter block.

16. A method for operating a memory device, including a memory cell array including first to mth rows (where m is an integer equal to or more than two), the method comprising:
    determining an hth row based on a result obtained by counting a number of accesses of each of the first to mth rows during a first period;
    refreshing an h−1st row and an h+1st row of rows adjacent to the hth row;
    determining an ith row based on a result obtained by counting a number of accesses of each of the first to mth rows during a second period; and
    refreshing an i−2nd row and an i+2nd row of rows adjacent to the ith row, wherein
    the first and second periods have different lengths and overlap each other.

17. The method as claimed in claim 16, further comprising:
    determining a jth row (where j is an integer less than m) based on a result obtained by counting a number of accesses of each of the first to mth rows during a third period; and
    refreshing a j−3rd row and a j+3rd row of rows adjacent to the jth row.

18. The method as claimed in claim 17, wherein:
    the second period is longer than the first period, and
    the third period is longer than the second period, and
    the first, second, and third periods overlap each other.

19. The method as claimed in claim 17, wherein:
    the hth row is a row which is most accessed during the first period, of the first to mth rows,
    the ith row is a row which is most accessed during the second period, of the first to mth rows, and
    the jth row is a row which is most accessed during the third period, of the first to mth rows.

* * * * *